United States Patent [19]

Hussey et al.

[11] Patent Number: 5,581,177
[45] Date of Patent: Dec. 3, 1996

[54] SHAPING ATE BURSTS, PARTICULARLY IN GALLIUM ARSENIDE

[75] Inventors: Alan B. Hussey, Agoura Hills; Edward A. Ostertag, Simi Valley; Lee Y. Song, Camarillo, all of Calif.

[73] Assignee: Teradyne, Inc., Boston, Mass.

[21] Appl. No.: 455,603

[22] Filed: May 31, 1995

Related U.S. Application Data

[63] Continuation of Ser. No. 86,502, Jul. 1, 1993, abandoned.

[51] Int. Cl.$^6$ ............................. G01R 31/28; H03K 5/01
[52] U.S. Cl. ........................ 324/158.1; 327/165; 371/27
[58] Field of Search ............................ 324/158.1, 73.1; 368/113; 371/20.1, 22.1, 27; 327/165, 166; 395/550

[56] References Cited

U.S. PATENT DOCUMENTS

| | | | |
|---|---|---|---|
| 4,063,308 | 12/1977 | Collins et al. | 364/221 |
| 4,231,104 | 10/1980 | St. Clair | 395/550 |
| 4,564,953 | 1/1986 | Werking | 377/52 |
| 4,724,378 | 2/1988 | Murray et al. | 371/27 |
| 4,724,379 | 2/1988 | Hoffman | 324/158.1 |
| 4,779,221 | 10/1988 | Magliocco et al. | 395/550 |
| 4,789,835 | 12/1988 | Herlein | 327/261 |
| 4,792,932 | 12/1988 | Bowhers et al. | 368/113 |
| 4,926,451 | 5/1990 | Yoshihara et al. | 327/155 |
| 5,058,087 | 10/1991 | Welzhofer et al. | 371/22.1 |
| 5,124,958 | 6/1992 | Jensen | 327/261 |
| 5,140,688 | 8/1992 | White et al. | 395/550 |
| 5,191,295 | 3/1993 | Necoechea | 327/158 |
| 5,274,796 | 12/1993 | Conner | 395/550 |
| 5,311,486 | 5/1994 | Alton et al. | 324/158.1 |
| 5,369,637 | 11/1994 | Richardson et al. | 370/84 |

FOREIGN PATENT DOCUMENTS

| | | |
|---|---|---|
| 2144228 | 2/1985 | United Kingdom . |
| 2200465 | 8/1988 | United Kingdom . |
| 2214314 | 8/1989 | United Kingdom . |

OTHER PUBLICATIONS

Inspec Abstract No. B9305–2570H–002, Chakrabarti, N. B., "GaAs Integrated Circuits", *Journal of the Institution of Electronics and Telecommunication Engineers*, vol. 38, No. 2–3, pp. 163–178, published Mar.–Jun. 1992.

*Primary Examiner*—Ernest F. Karlsen

[57] ABSTRACT

An improved ATE and methods are provided by forming and comparing pattern bursts digitally in gallium arsenide IC's. A desired burst waveform at the DUT terminal is facilitated by setting into timing generators between bursts in effect a plurality of period waveforms constituting a palate from which by successive choice the DUT-terminal driver and comparator waveforms may be built up, each period driver waveform including a predetermined number (including zero) of rising or falling edges, any particular such edge in any particular period driver waveform being provided by the timing generators and each period comparator waveforms including voltage levels to be compared and edges provided through the timing generators, the timing generators being settable only between bursts, selection of desired palette waveforms being provided for each period by a pattern memory.

19 Claims, 16 Drawing Sheets

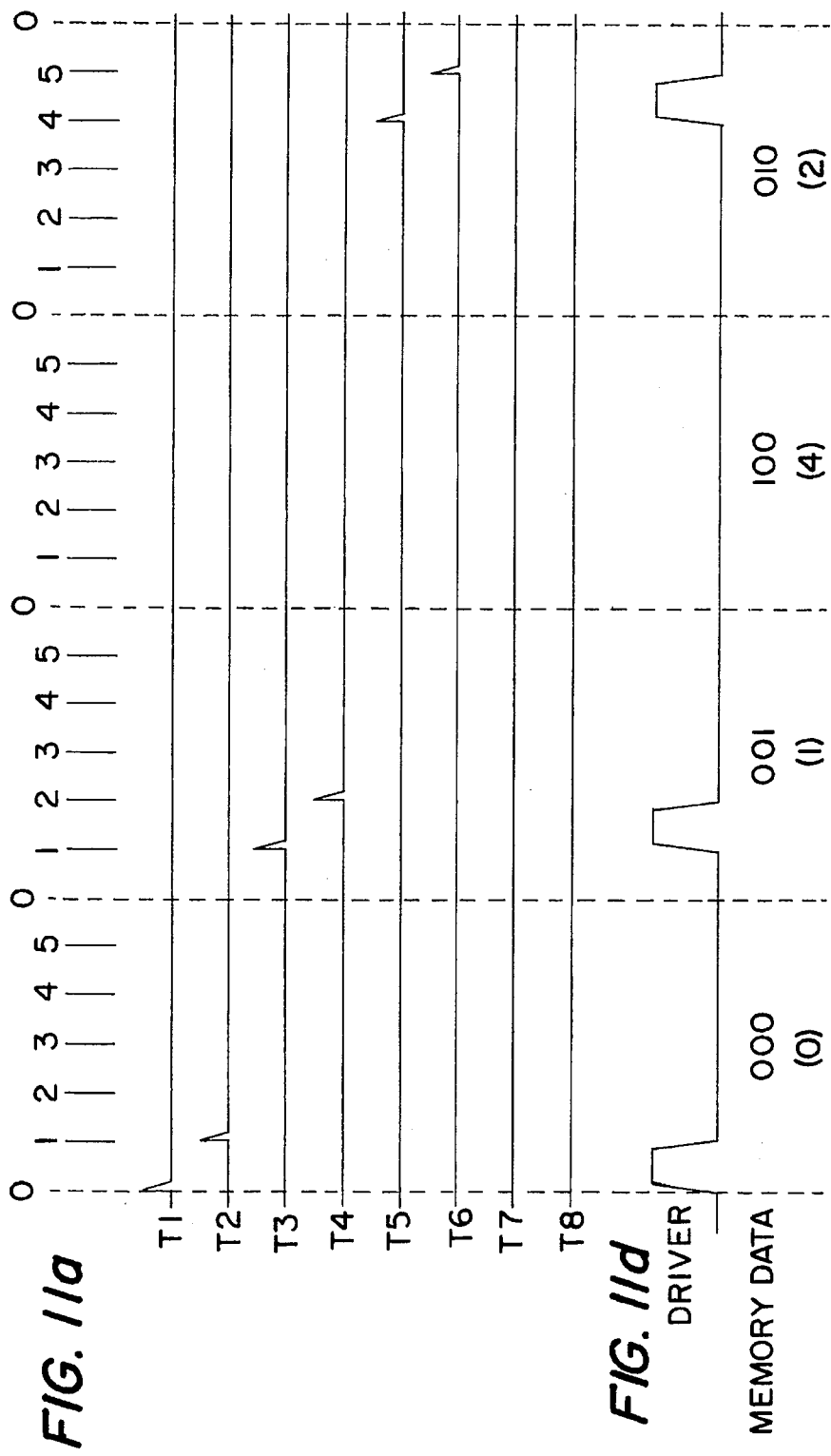

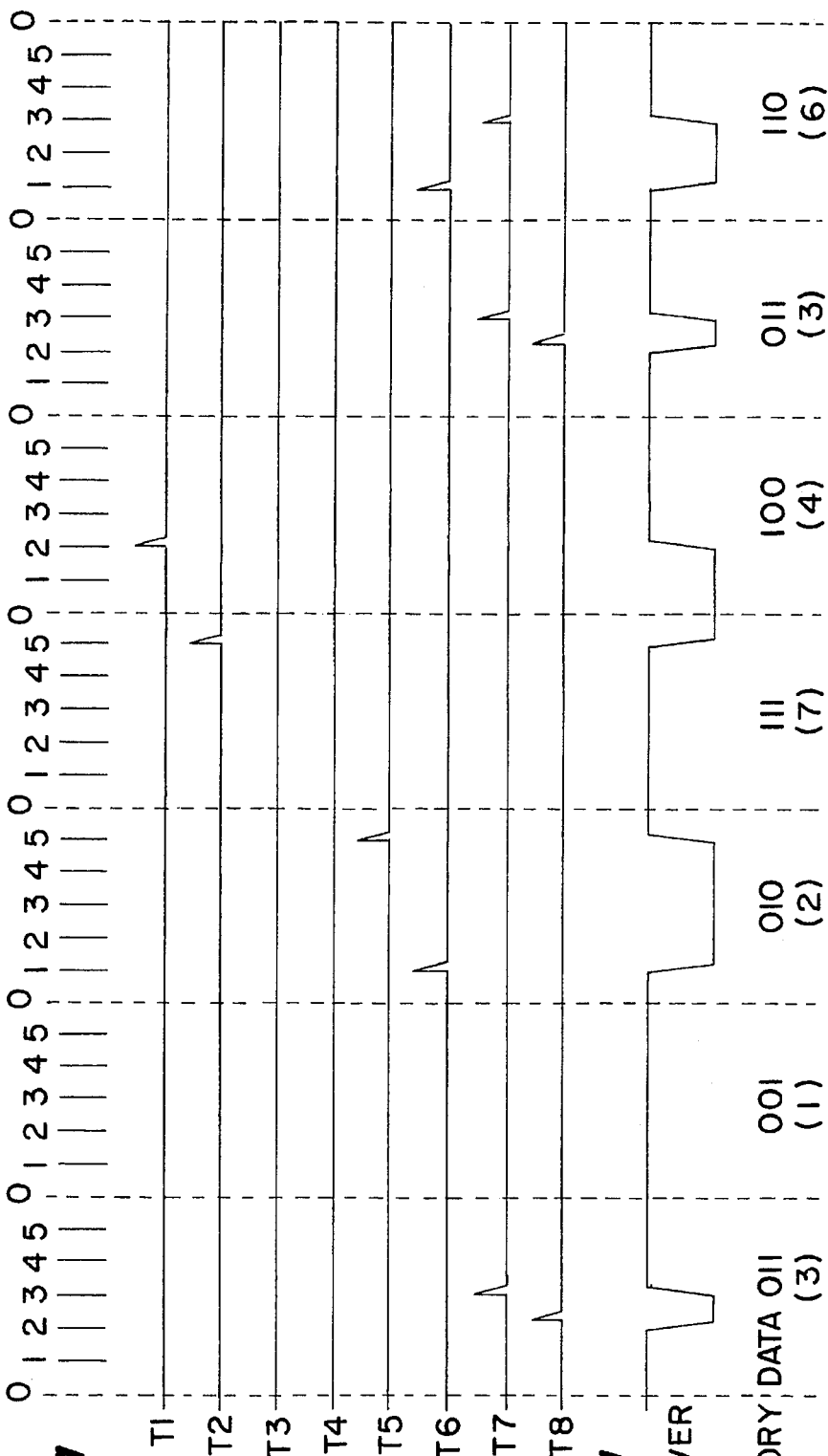

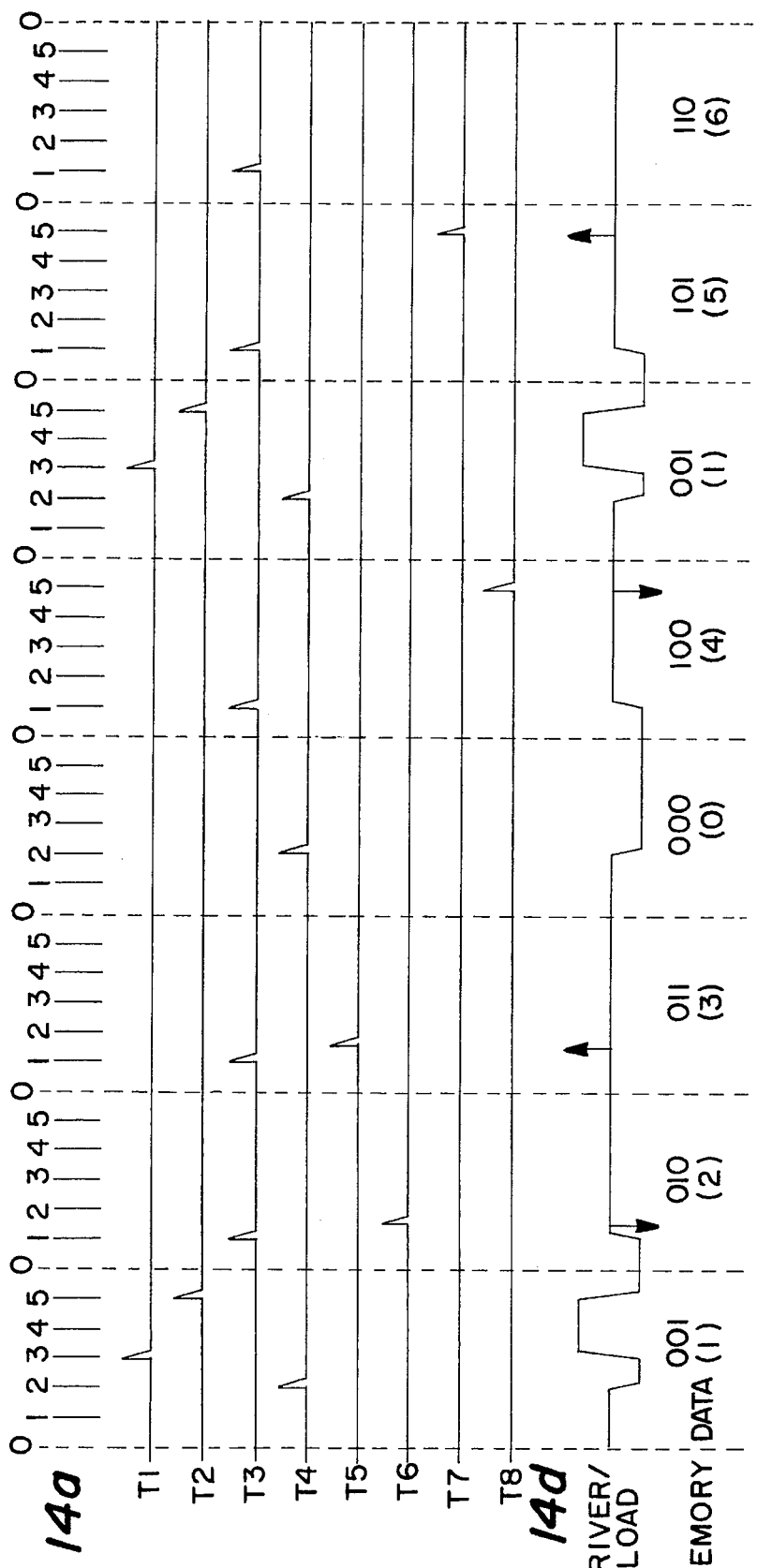

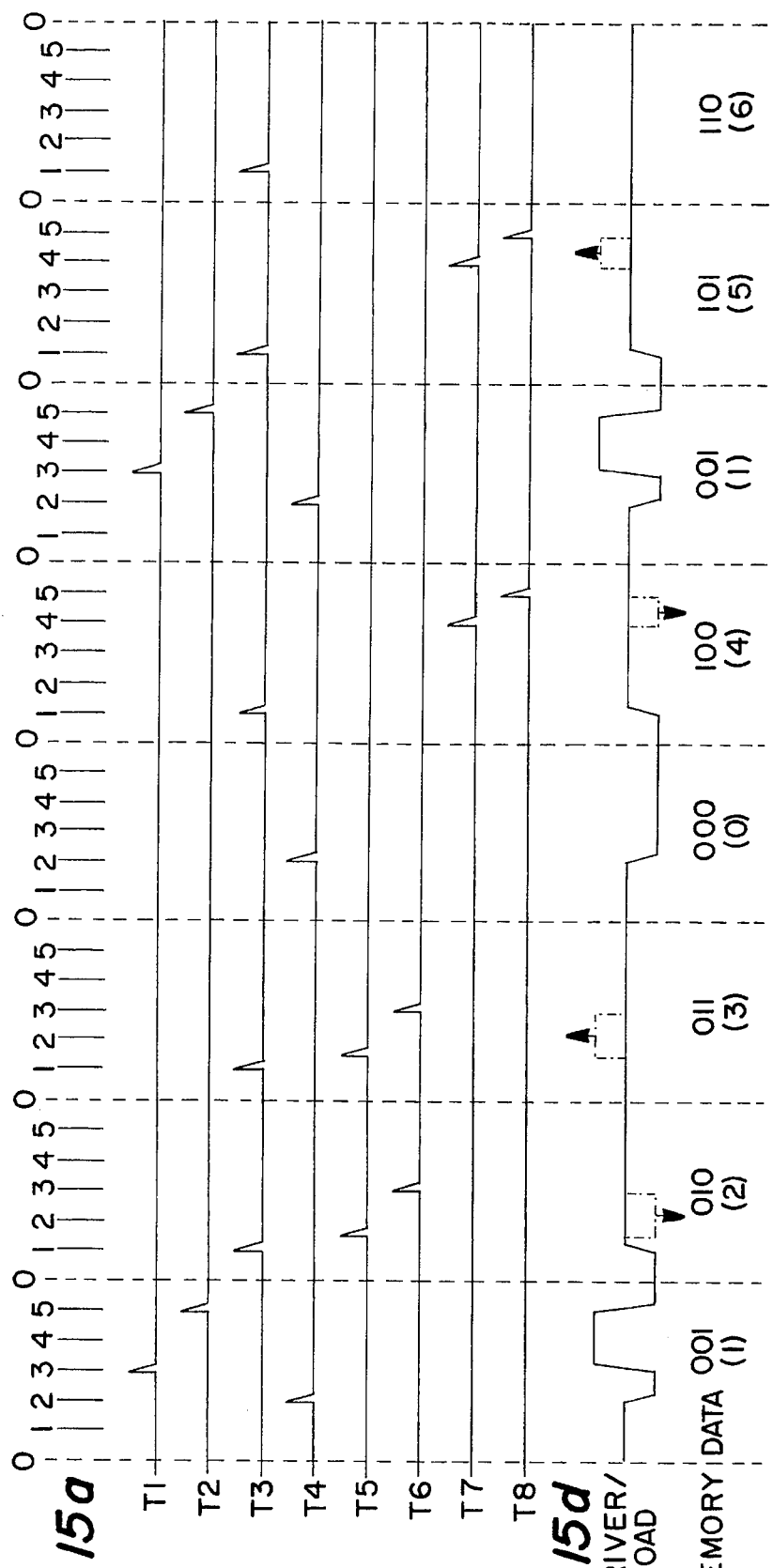

SHAPING ATE BURSTS, PARTICULARLY IN GALLIUM ARSENIDE

This application is a continuation of application Ser. No 08/086,502, filed on Jul. 1, 1993 now abandoned.

FIELD

This invention relates to testing integrated circuits ("IC"s), in particular automatic testing of very-large-scale integrated ("VLSI") circuits.

BACKGROUND

It is known in the prior art to provide automatic test equipment ("ATE") to evaluate VLSI chips by sending electrical bursts into certain terminals and comparing resultant terminals outputs with selected standards.

It is known also to use gallium arsenide chips for ATE analog circuitry (e.g., in drivers and comparators).

It is known to produce, in silicon, driver edge positioning by varying the delay produced in particular timing generators from period to period within a burst.

Further it is known in the silicon prior art to refine delays produced by timing generators by means of verniers given improved accuracy by means of complex and expensive IC circuitry, sometimes including additional correction circuits.

It is further known in the prior silicon ATE art to provide elaborate calibration circuits internal to an IC such that an edge delay desired at the DUT terminal is linearly directly responsive to a command at the computer, colinearly for each channel.

Finally, it is known. in the silicon ATE art to produce DUT terminal edges at selected delays of greater length than a period, by using extra (e.g., "even/odd") timing generators.

SUMMARY OF THE INVENTION

It has been discovered that improved ATE and methods may be provided by forming and comparing pattern bursts digitally in gallium arsenide IC's.

In another aspect of the invention, a desired burst waveform at the DUT terminal is facilitated by setting into timing generators between bursts in effect a plurality of period waveforms constituting a palette from which by successive choice the DUT-terminal driver and comparator waveforms may be built up, each period driver waveform including a predetermined number (including zero) of rising or falling edges, any particular such edge in any particular period driver waveform being provided by the timing generators and each period comparator waveforms including voltage levels to be compared and edges provided through the timing generators, the timing generators being settable only between bursts, selection of desired palette waveforms being provided for each period by a pattern memory.

In another aspect, a palette may include a plurality of sets each including a cooperating computer-programmable register, a multiplexer, and a pulse modulator, the three acting as a set to command selected wave-forming activity in the pulse modulator, or a plurality or multiplicity of such sets.

In another aspect, it has been found that through direct software use in processing programmed delay settings, a selected waveform edge may be delayed by a time corresponding selectively to the sum of a predetermined number of clock cycles plus a predetermined number of half clock cycles plus a predetermined vernier given time of less than a half clock cycle without including in the IC complex and expensive circuitry; and that delay may be augmented by including a predetermined number of periods, each including a predetermined number of clock cycles, without using extra timing generators.

In another aspect is selectively provided a multiplicity of timing generators, each with one or more connections with a timing enable register to provide signals that permit a particular timing generator to be fired through the pulse modulator or not, or cause the timing generator to be overridden so that the particular generator may be used in the comparator portion of the overall circuit.

In another aspect, the invention compensates for variable delay effects in gallium arsenide owing to variable duty cycle (proportion of wave width to period width, in time) and frequency by keeping verniers running throughout, including between bursts and including introducing palette data to a pulse modulator following a vernier (rather than, for example, to a match block ahead of a vernier); by shortening delays as as practical; and by using software to process measured pre-match (back through clock) and post-match (through verniers) delays to minimize remaining delay error.

PREFERRED EMBODIMENT

There follows a description of a preferred embodiment of the invention.

DRAWINGS

FIG. 1 is a block diagram showing the relationship among main subassemblies of the preferred embodiment.

FIGS. 2, 3, and 4 are block diagrams of first, second, and third portions of a gallium arsenide integrated circuit chip embodying the invention.

FIGS. 11(*a*) through 11(*d*) are respectively traces illustrating timing guide firings, a lookup palette setup chart, a timing enable register chart, and a driven trace, as are FIGS. 13(*a*) through 13(*d*), 14(*a*) through 14(*d*), and 15(*a*) through 15(*d*).

Figure 12:
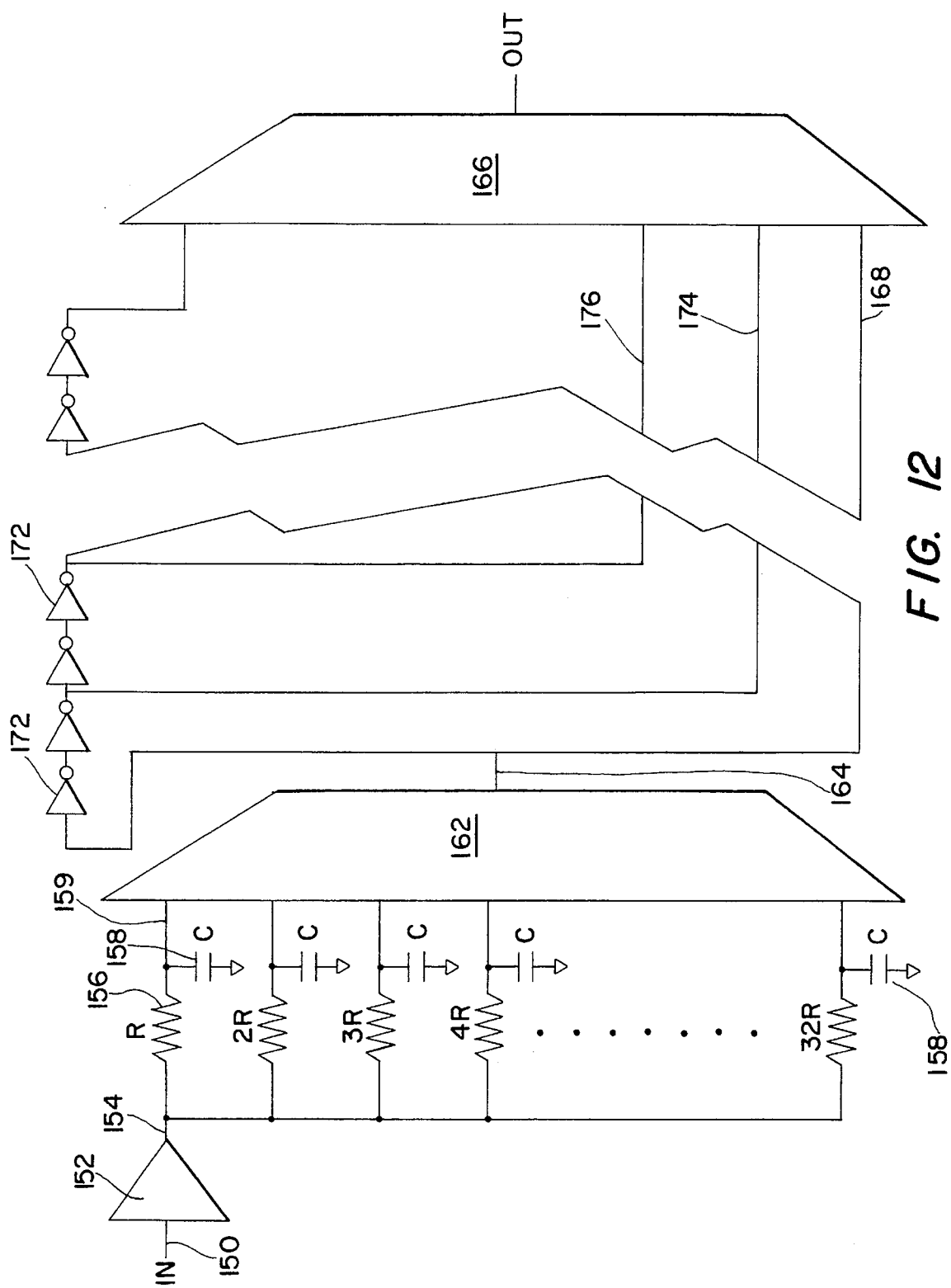

FIG. 12 is a circuit diagram of the vernier of the invention.

Figure 16:
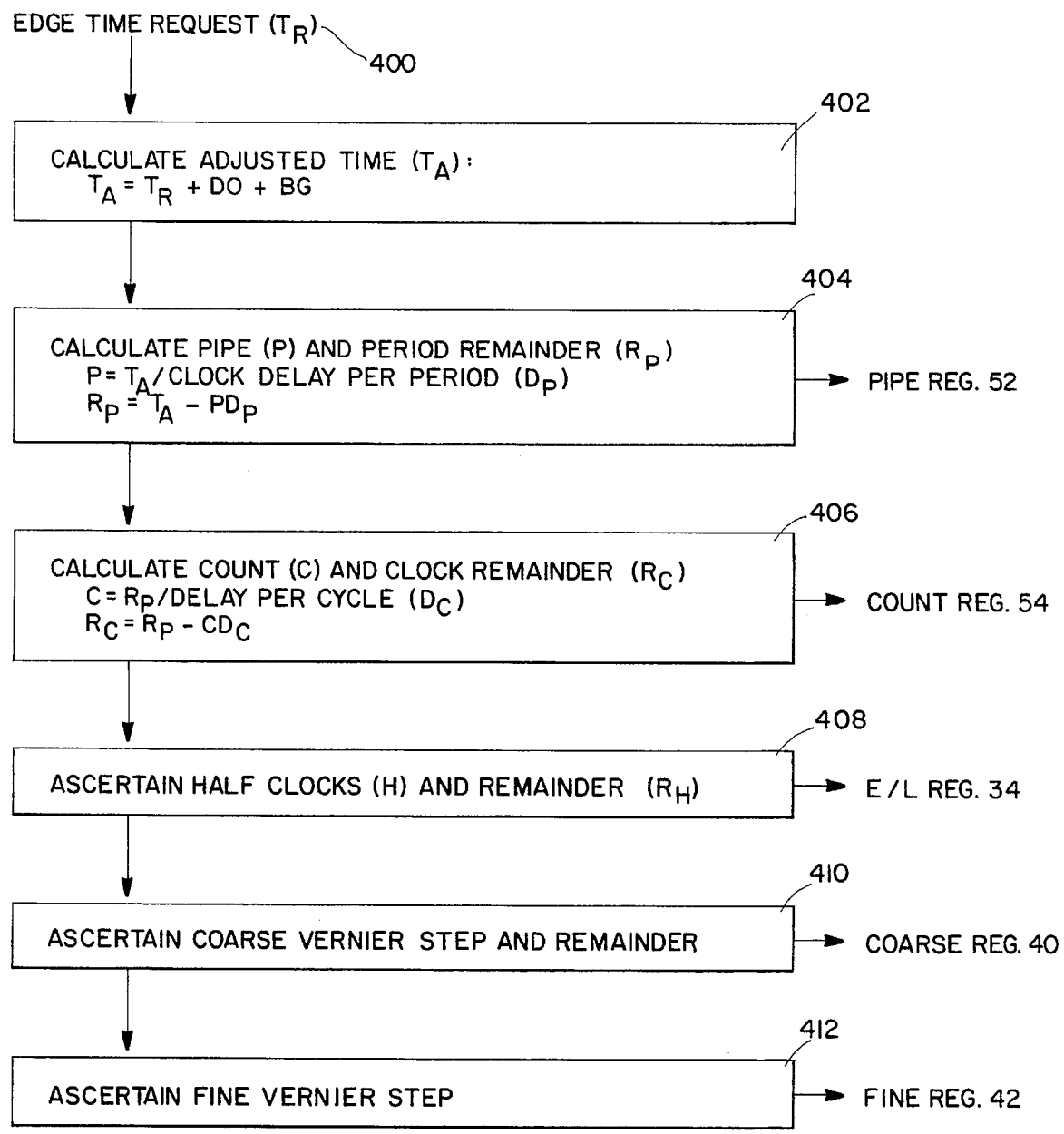

FIG. 16 is an edge delay processing chart.

STRUCTURE

In the preferred embodiment, the integrated circuits for test are electrically connected to pins and mounted in housings, and often referred to overall as devices under test ("DUT").

Figure 1:
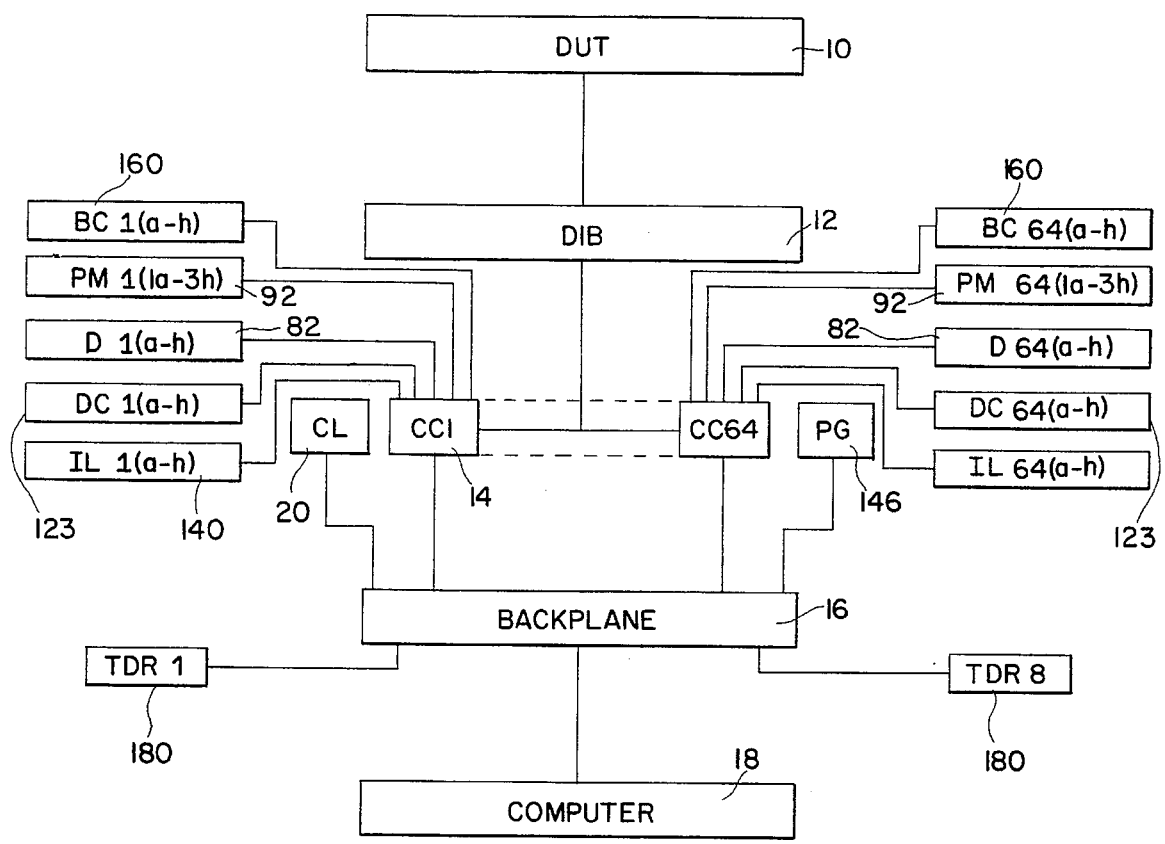

As shown in FIG. 1, a DUT 10 with 512 pins is received in a device interface board ("DIB") 12, which has 512 sockets arranged and sized to interfit with the pins of the DUT. To the DIB are electrically connected through 64 channel cards 14 ("CC") a backplane 16, which is in turn electrically connected to a computer 18.

The computer 18 includes, of course, two sorts of software: generic software used with more than one model of DUT, and specific software concerned with the particular model of DUT being tested. In the preferred embodiment, the two sorts of software exist for each separate model of DUT as two portions of a single magnetic disk.

The backplane carries a clock 20 of the phase locked loop ("PLL") type, with a divide ratio enabling its being programmed to deliver a predetermined output at a frequency within the range 200 to 300 megahertz (a range so being provided to permit some further waveform edge delay adjustment if desired); and is set, in the preferred embodiment operation described, at 250 megahertz.

Figure 2:
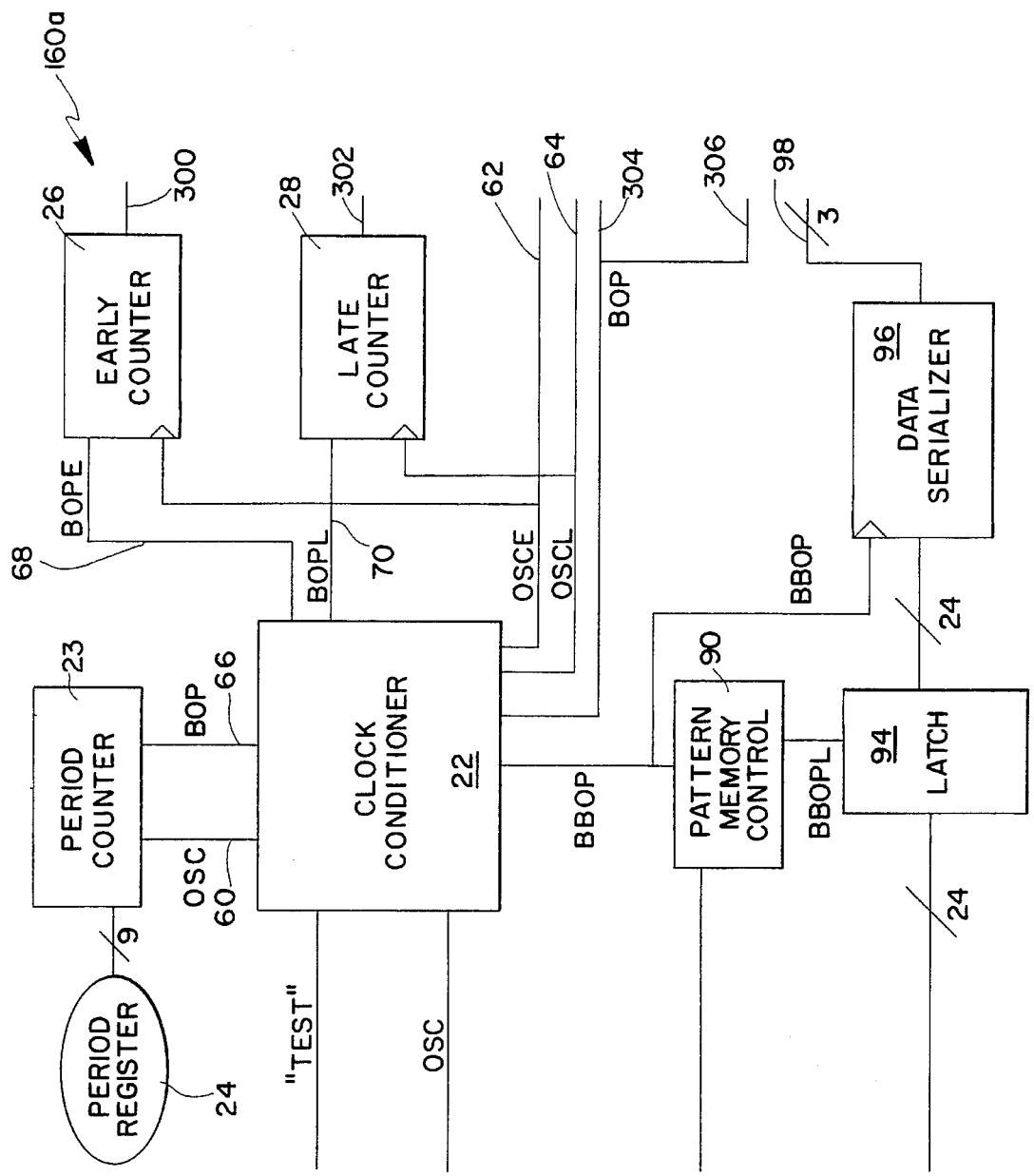
Figure 3:
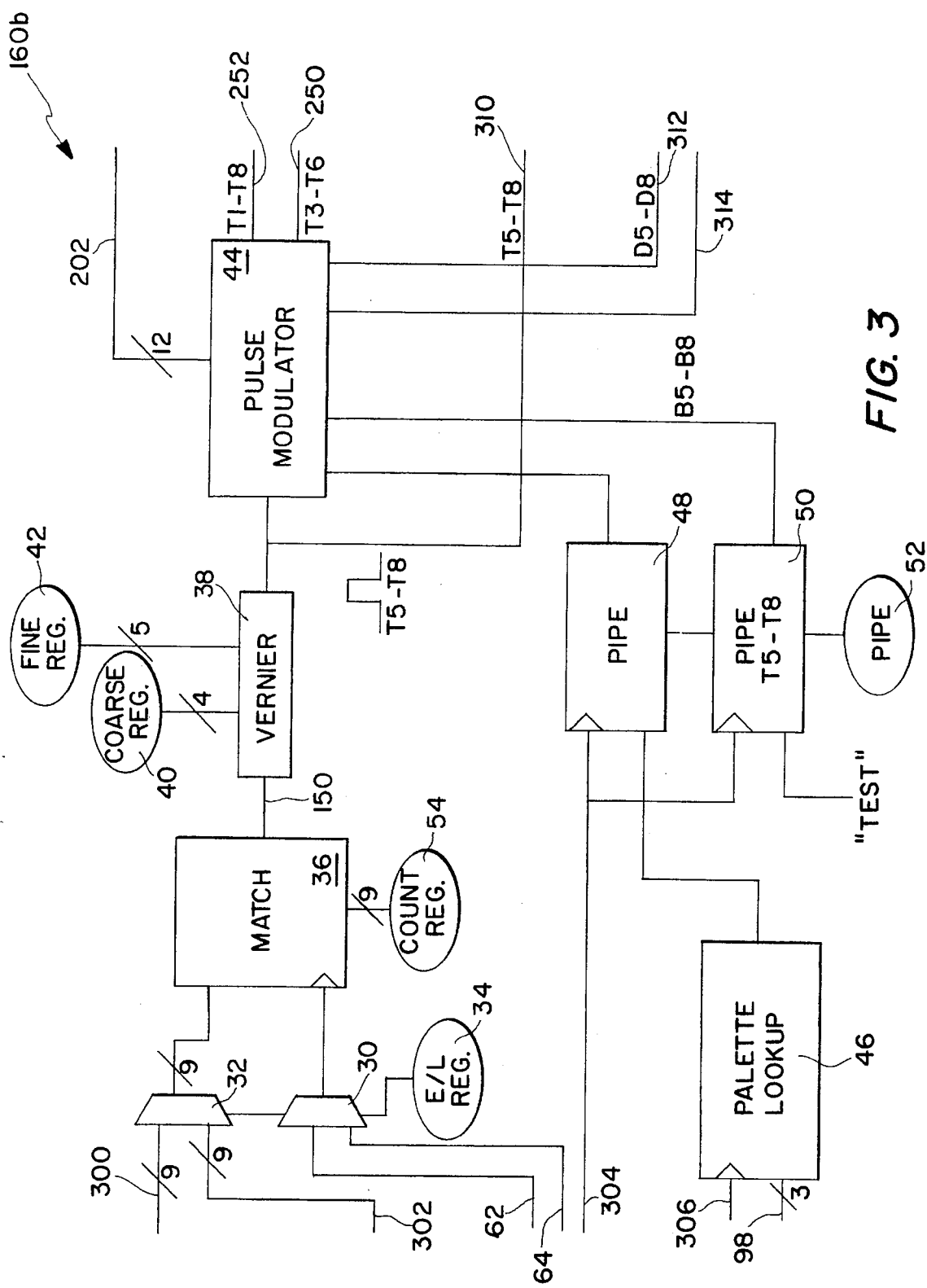
Figure 4:
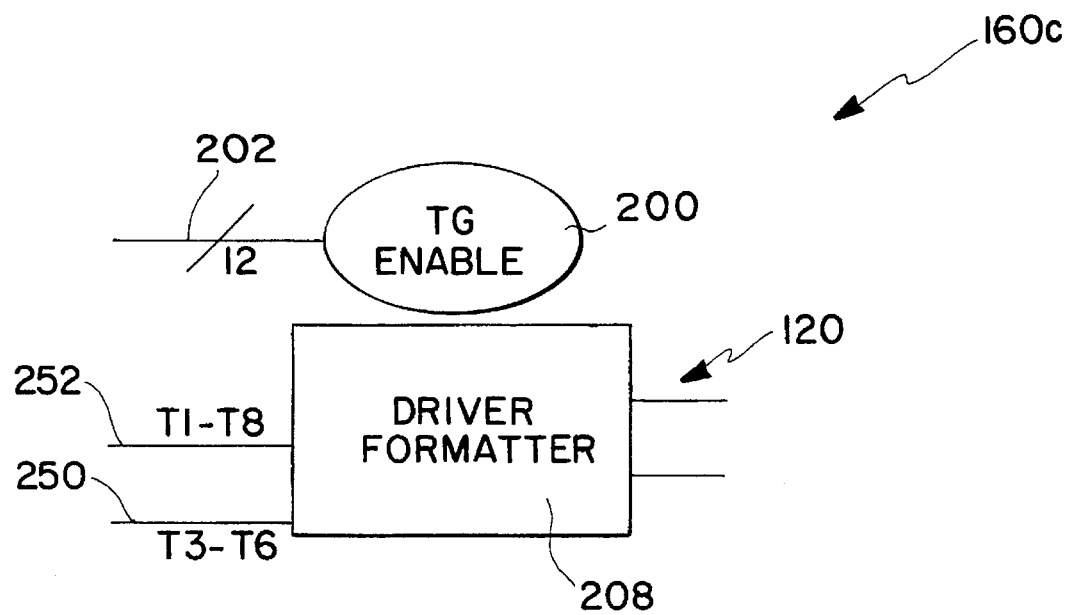
Figure 4:
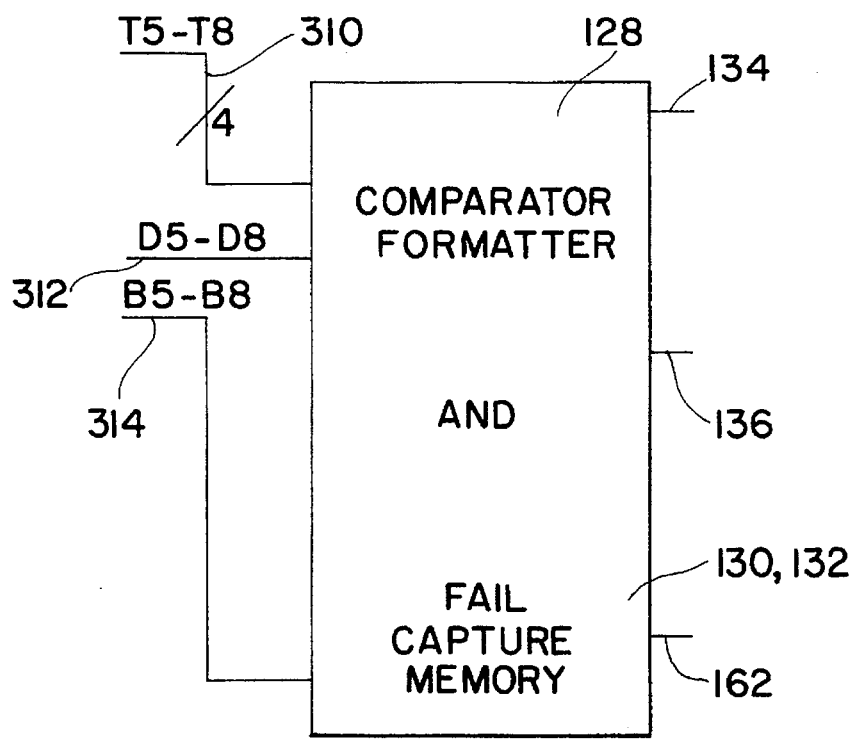

A gallium arsenide burst integrated circuit, or burst waveforming and consequence-evaluating chip ("burst chip", "BC") 160, FIGS. 1 and 2–4, is dedicated to each pin in the DUT (i.e., also, to each of the corresponding channels or slices of test apparatus). The burst chip 160 is designed using standard cell design methodology and direct coupled FET logic (DCFL). This BC is five millimeters by eight millimeters in size, and has power dissipation of only five watts. Each BC is packaged in a 164-pin ceramic quad-flat pack, along with seven others, each under a heat sink and upon a 10-layer circuit board channel card, using mixed through-hole and surface mount technologies (not shown). (FIGS. 2, 3, and 4 are together a block diagram of a BC (160 (or 160a, 160b, 160c) according to the invention except that only one of the eight timing generators (hereinafter explained in detail) in each BC is shown (in FIG. 3), although others are referred to as, e.g., T3 or T8. (Computer 18 is bussed (not shown) to interact with various components of this BC, as will be seen.) Each CC carries eight BC's 160 (e.g., BC 64(a–h)).

The clock or oscillator 20, which functions from the time the power "On" button is pushed, feeds into the clock conditioner 22 (FIG. 2), which transmits it to the period counter 23, which in turn at the preset count in period register 24 delivers to the clock conditioner 22 a "beginning of period" ("BOP") signal. (Such a signal is also and alternatively delivered, simultaneously to all channels, on the first rising edge upon initiating "Test" (as hereinafter discussed): an ORed transition detector orders all channels to reset clock to zero and send a BOP pulse on the next clock pulse when either the period register 24 ends a count or "Test" is begun.) The clock conditioner 22 transmits the BOP signal to both an early counter 26 in which runs the oscillator 20 waveform and also a late counter 28 in which runs an oscillator 20 waveform inverted in the clock conditioner 22 to delay the waveform leading edge 180° in time.

Each BC has in it eight timing generators 160b (one of which is shown in FIG. 3), each with a clock multiplexer 30 and a count multiplexer 32, arranged in pairs (i.e., one pair per timing generator ("TG")), each pair (one count and one clock) being ganged to its own of eight early/late registers 34, so that a setting of either early or late given each register by the computer makes each pair of ganged multiplexers 30, 32 go either both early (compared to the "late" setting), or both late.

Each BC 160 includes also eight match elements 36, eight verniers 38 (each including a coarse vernier and a fine vernier and associated, respectively, coarse register 40 and fine register 42), and eight pulse modulators 44; as well as eight palette lookups 46; and eight first pipes 48 and four second pipes 50 (in TG's 5–8) ganged with eight pipe registers 52.

Other features of structure may conveniently be mentioned in connection with discussion of operation of the preferred embodiment.

OPERATION

The computer automatically loads the pattern memory, something which requires about ten minutes. During this time the computer also programs all the registers, clears the fail capture memory (of whatever may have been set in by any previous test), sets into the pattern memory what first address to use in the first burst, and sets the desired levels into the driver, dual comparator and I-loads; to all of these it is connected by a bus, not shown.

The clock provides, from the time the power "On" button is pushed, in the operation herein described, a 250 megahertz output.

The clock output as above described is fanned out and buffered in various stages and introduced into the clock conditioner 22, where it is buffered (amplified in power) into each of three output lines 60, 62, 64, and delayed 180° as well (to give a "late clock") into one of the three.

One of the simply buffered clock output lines (60) goes from the clock conditioner into the period counter 23, into which is also fed from the period register 24 the number-of-cycles count chosen for (and introduced, as already noted, into the period register 24 by the computer 18) the "period" (integer number of oscillator 20 360° cycles, "cycle") to be used in timing. When the period counter 23 counts to the number of cycles set in the period register, the period counter produces a pulse with a high leading edge (a beginning of period, or "BOP", pulse), resets the period counter to zero, and sends this BOP pulse back to the clock conditioner on line 66.

The BOP pulse (really, a clock cycle gated by the period register) is in the clock conditioner then formed into two output pulses (over lines, respectively, 68 and 70), one of which is clocked on each of the clocks (one on the early clock and one on the late clock, so that the leading edge of the one clocked on the late clock ("BOPL") is half a cycle in time behind the leading edge of the other ("BOPE"). The BOPL is in sync with a pulse of the late clock output 64, as is the BOPE with the early clock 62.

Also emerging from the clock conditioner are the buffered clock outputs, one early ("OSC E"), as noted, and the other late ("OSC L"), respectively on lines 62 and 64.

It may be noted that the BC nine-wire line 300 outputs early counter 26 and inputs count multiplexer 32, nine-wire line 302 outputs late counter 28 and inputs count multiplexer 32, OSC E line 62 is outputted from clock conditioner 22 into clock multiplexer 30, OSC L line 64 is outputted from clock conditioner 22 into clock multiplexer 30, BOP line 304 is inputted from clock conditioner 22 and outputted into pipe 48 and through line 306 into palette lookup 46, and 3-bit line 98 is outputted from data serializer 96 into palette lookup 46.

Arrival at the early counter of BOPE resets on the next clock leading edge that counter to 0, whereupon begins a count of early cycles, through the count multiplexers registered early. At the same time, the early clock passes through the clock multiplexers registered early. If the early/late ("E/L") register 34 of one of the eight (e.g. "TG 1") is set at, say, "early"; and the count register 54 of TG 1 is set at, say, 3; then when the early counter counts to 3, meaning that three cycles have passed through the TG1 clock multiplexer 30, the TG 1 match element 36 amplifyingly gates flow through the corresponding (TG 1) clock multiplexer 30 to the TG 1 vernier 38. This match function uses exclusive-OR ("X-OR") gates to perform a comparison between the count value and the value contained in the count register. BOPL arrives at the late counter a half cycle later in time than BOPE arrives at the early counter, and similarly, any pair of ganged multiplexers (e.g., in TG 2) registered to late and three allows signal passage through its (TG 2) match element to the TG 2 vernier.

The eight sets of E/L registers 34 1 through 8 (e.g., E/L 1), clock multiplexers 30 1 through 8 (e.g., "CM 1"), count multiplexers 32 1 through 8 (e.g., "Co. M 1"), count registers 54 1 through 8 (e.g., "Co. R 1"), match units 36 1 through 8 (e.g., "M1"), verniers 38 1 through 8 (e.g., "Vi"), coarse registers 40 1 through 8 (e.g., "CR 1"), and fine registers 42 1 through 8 (e.g., "FR 1") provide with other elements repeated eight times eight timing generators (TG 1 through TG 8), each with its correspondingly numbered elements (e.g.: E/L 1, CM 1, and Co. M 1; M1; and V1, CR 1, FR 1) respectively.

One pulse is produced by each timing generator during each period (unless its count register is set higher than the period register, which would ordinarily be pointless). If an early clock and counter have been chosen for a particular timing generator, a pulse leading edge synchronized with a cycle leading edge at a time corresponding to the delay imposed by the early counter enters the respective vernier.

The coarse register, with four wires into the vernier, is settable in its registers, by the computer, to provide in the vernier delays, settings in the coarse register of delays at 0 through 15 steps of delay, each step being of about 300 picoseconds; and in the fine register of 0 through 31 steps, each of about 25 picoseconds.

FIG. 12 illustrates the vernier.

Line 150 from match block 36 is buffered in amplifier 152 into line 154 connected with 32 resistors in parallel; resistances are respectively twice, thrice, and up to thirty-two times that of the lowest resistance 156. Connected between each resistance and ground is a capacitor 158; all capacitors have the same capacitance. The parallel lines 159 enter multiplexer 162; each line 159 produces a delay of about 25 picoseconds more than its predecessor of one less multiple of the value of R 156, and multiplexer 162 is set to transmit the one chosen, to provide the fine vernier result.

This result then moves through line 164 into the coarse vernier, in which multiplexer 166 is set to select the delay path desired; if no delay, line 168, if 300 picoseconds, line 174, which includes two amplifier inverters 172, each of which provides a 150 picosecond delay, for a total of 300. To obtain a 600 picosecond delay, line 176 is set into multiplexer 166, and so on through a total of 15 lines in addition to line 168, for up to a 4500 picosecond delay is this coarse portion of the vernier.

Because of our discovery that software may be appropriately used with the vernier portions to correct for manufacturing variations, the numbers 25 and 300 picoseconds are target numbers only, and may deviate by tens of percents.

Along with the clock 20, all the elements operation of which have been thus far discussed function continuously from turning on the backplane power, even though no "Test" signal, to produce burst, has been given.

Provision for operation before and between bursts of timing generator elements transmitting driver trace shaping edges (right up through verniers) in precisely the way they function before and between bursts provides a very great constancy of delay through these portions of each timing generator, facilitating the novel mode of delay correction outside the BC and in software, part of the invention.

A burst ends, as is well known in the art, when a predetermined period count set by the computer into a register is reached; the burst signal from pattern generator 146 then goes to zero. In due course, as understood in the art, the computer program sends a succeeding "Test" or burst signal.

The computer 18 (when "Test" is ordered, by typing into it) instructs the pattern generator 146 to send its output high, to send a signal to all channels to produce the first set of bursts of a test (which first set, like any subsequent one, includes 512 simultaneous bursts, one per channel, the bursts in each set having the same number of periods, each period having the same cycle count synchronized as above set forth).

Each TG pulse modulator 44, pursuant to command from palette lookup 46 through pipe element 48 of the timing generator (FIG. 3) selectively gates therethrough pulses from that TG's respective vernier 38. Secondly, each pulse modulator reforms the shape of each pulse gated through it into a spike, by splitting an entering pulse into two pulses, delaying and inverting one of these two pulses, and "ANDing" an uninverted of these two pulses with the delayed and inverted pulse. Third, the pulse modulator of each timing generator cooperates with a single timing generator enabler register ("TER") 200, FIG. 4, which connects with them through 12-bit lead 202, as will be seen.

Referring to FIGS. 3 and 4, 12-wire line 202 joins pulse modulator 44 and TER 200, lines 252 and 250 join the pulse modulator and driver-formatter 208, the lines 310 join the vernier 38 and comparator formatter 128, lines 312 join pulse modulator and comparator formatter, and lines 314 join the pulse modulator and the fail capture memory.

Figure 5:
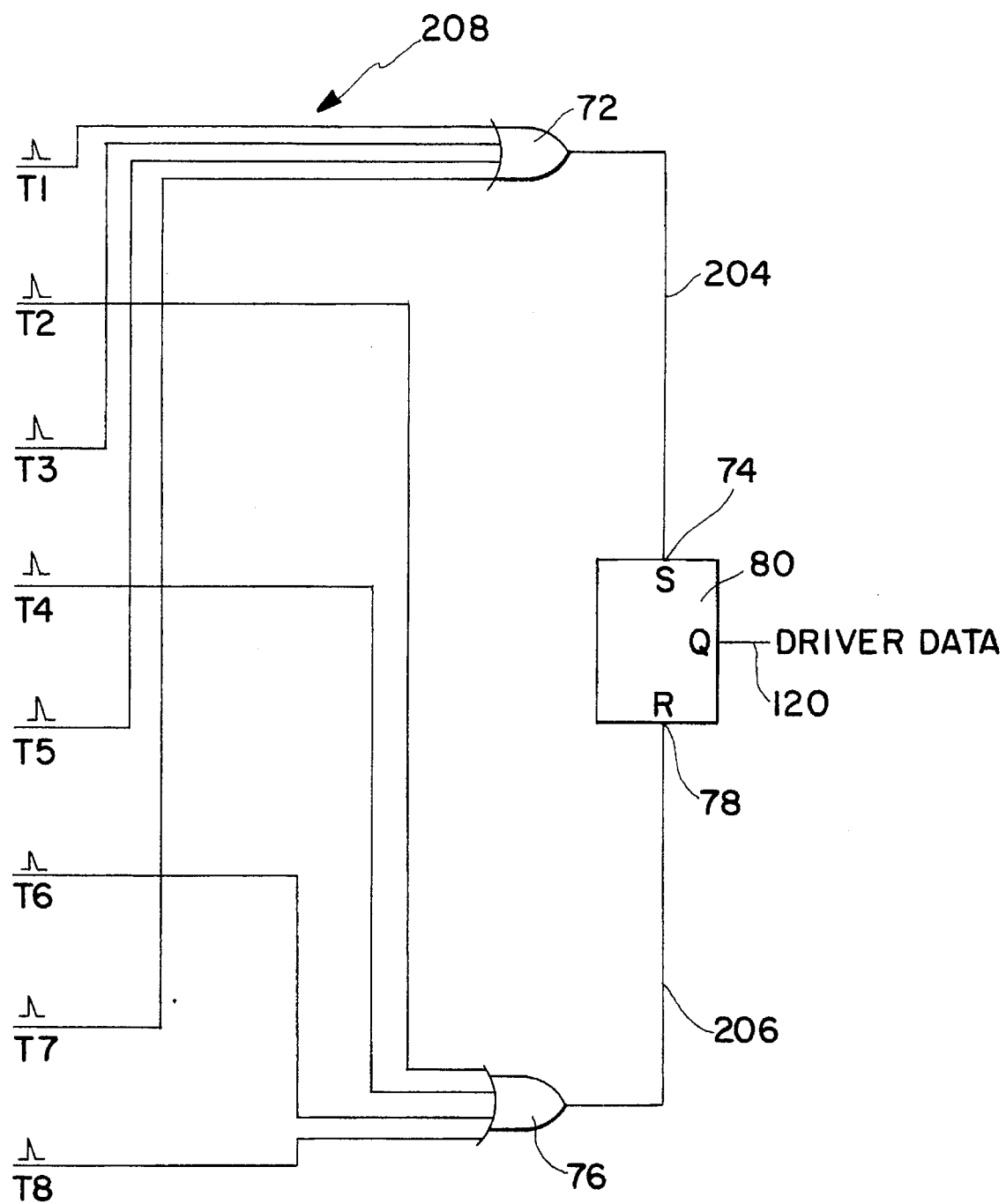
FIG. 5 is a circuit diagram of a portion of the driver formatter shown in FIG. 4.

The pulses delivered from the pulse modulators 44 all move into a single driver formatter 208, which is partially illustrated in FIG. 5. Lines from odd timing generators (TG's 1, 3, 5, and 7) go to a first OR gate 72, the output from which goes to the "set" terminal 74 (ordering output voltage to go high) of S-R (set-reset) flipflop 80. Lines from even timing generators 2, 4, 6, and 8 go to a second OR gate 76, from which to the reset terminal 78 of the same flipflop 80. If any line going into either OR gate carries spike (and only one of the eight lines will in normal operation spike at any one time), its output line spikes, to respectively actuate either the set (odd) or reset (even) terminal. The output of the S-R flipflop 80 enters the data input of a conventional ATE pin driver 82, eight of which are carried by each channel card 14, one for each channel.

The driver formatter also includes an on/off circuit (not shown), which is identical with FIG. 5 except that only two inputs feed one of the two OR gates, and two other inputs feed the other. Outputs from the pulse modulators of TG 3 and 5 are inputs to an OR gate controlling the set terminal of an S-R flipflop; outputs from those of TG 4 and 6 are inputs to an OR gate controlling the reset terminal of the flip-flop. If any input spikes (only one of the four can at the same time), its OR gate spikes, actuating either set (driver turned off) or reset (driver turned on). When the driver is on the I-load is off and vice-versa.

One further function of the clock conditioner 22 is to provide a BOP signal to the pattern memory control 90; this particular BOP output is so conditioned that it is only outputted when the burst-causing signal from the pattern generator 146 is and remains high. This BOP signal (the burst BOP, or "BBOP") goes as noted to the pattern memory control 90 ("PMC"), into which an initial address has been set by the computer 18. The PMC then provides this initial address to the pattern memory 92, which is made up of three high-speed, static, byte-wide (eight bit) memories connected in parallel, mounted outside each BC, on a channel card 14. An address counter (not shown) in the memory control 90 provides the address terminal of the pattern memory 92 with addresses (each containing 24 bits of data) successive to the initial address provided by the computer. The memory control 90 also transmits a further conditioned BBOP to the latch 94—"BBOPL"—conditioned further to be output only once for each eighth BBOP. At the start of a burst, BBOPL causes the latch to copy 24 bits from the pattern memory the single cycle of BBOPL. BBOP during each of its pulses causes the data serializer 96 to successively copy groups of three bits from the latch 94. At each BBPOL signal, 24 further bits, at further succeeding addresses, are copied by the latch 94 from the memory 92. The data serializer 96 fills eight times for each time the latch 94 fills once.

Upon a BBOP signal, each of the BC's eight palette lookups 46 draws from that BC's data serializer 96 the group of three bits next in order for all the eight.

Figure 6:
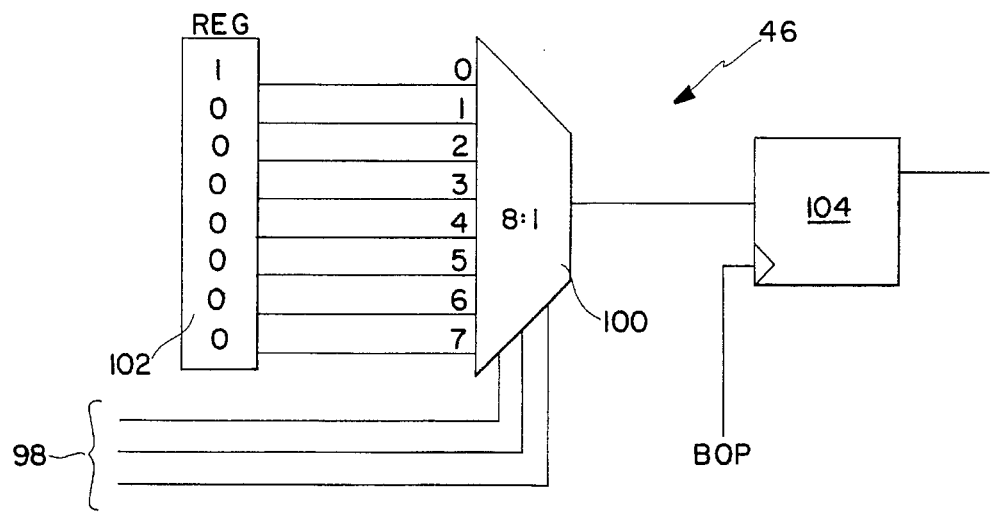
FIG. 6 is a circuit diagram of one of the data circuits in the palette lockup of FIG. 3.

The palette lookup 46 for one of the BC's eight TG's (e g., "L1", arranged to work with TG 1, as are L2–L8 with respect to, respectively, TG 2–TG 8) is shown in more detail in FIG. 6. The three bit output just mentioned is fed over the three lines 98 to 8:1 fire control multiplexer 100. The bit input causes the multiplexer to close a circuit between a chosen 0 or 1 programmed into the fire control register 102 into latch 104, through which on BOP the 0 or 1 chosen passes through the pipe 48 to the pulse modulator 44.

Figure 7:
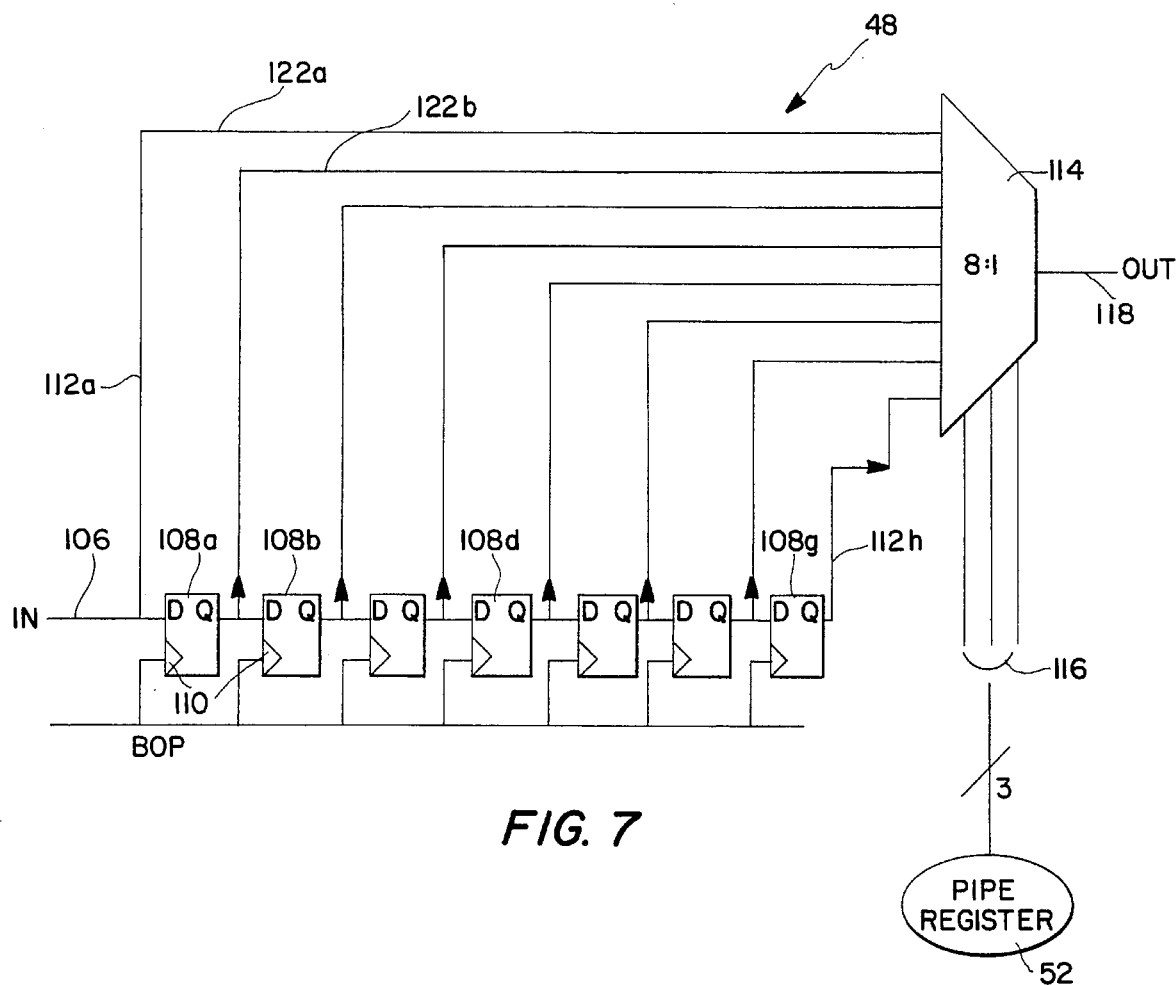
FIG. 7 is a circuit diagram of a portion of the pipe shown in FIG. 3.

The pipe 48 for one of the BC's eight TG's (e.g., "PI", to work with TG 1, as do P2–P8 respectively with TG 2–TG 8) is shown in more detail in FIG. 7. The output of palette lookup 46 goes to input terminal 106 following which are in series 7 D-flipflops 108a–g, each with data input D and output Q. BOP is connected in parallel (through arrowhead-indicated "clock" terminals 110—counting here, as noted, not on the clock, but rather on the BOP) into each D-flipflop. Multiplexer input lines 112a–h extend from the D-flipflop series line, before each D-flipflop 108a–g and after the last D-flipflop 108g, into the eight inputs 122a–h of 8:1 multiplexer 114, which is arranged to receive from its one of the eight pipe registers 52 in BC over lines 116 a 3-bit signal programmed thereinto by the computer for applicability throughout a burst. Pipelining, the next BOP after the BBOP releasing the data in the latch introduces that data into the first D-flipflop 108. If the multiplexer 114 is set at 0, the data also goes directly through the multiplexer to the out terminal 118. If the multiplexer 114 is set at 1, on the next BOP the data that had been in the first D-flipflop moves through the second multiplex line 122b and then out terminal 118—a delay of one period having thus been achieved. A 2-setting on the multiplexer similarly results in movement on a second BOP from second D-flipflop 108b and a two-period delay. And so on, up to a delay availability of 7 periods.

Data moves from the pipe output terminal 118 to the respective pulse modulator 44, where it cooperates with the output of the respective timing generator as above described in commanding an output for the driver formatter 208 and in turn through the driver 82 into the DUT.

After the burst takes its course through the DUT, outputs move over the DUT input-output lines and output lines to the dual comparators.

The drivers 82 and dual comparators 123 are mounted on the channel cards, eight on each card, one for each channel.

Each dual comparator includes, as is well known in the art, a high comparator and a low comparator.

Figure 8:
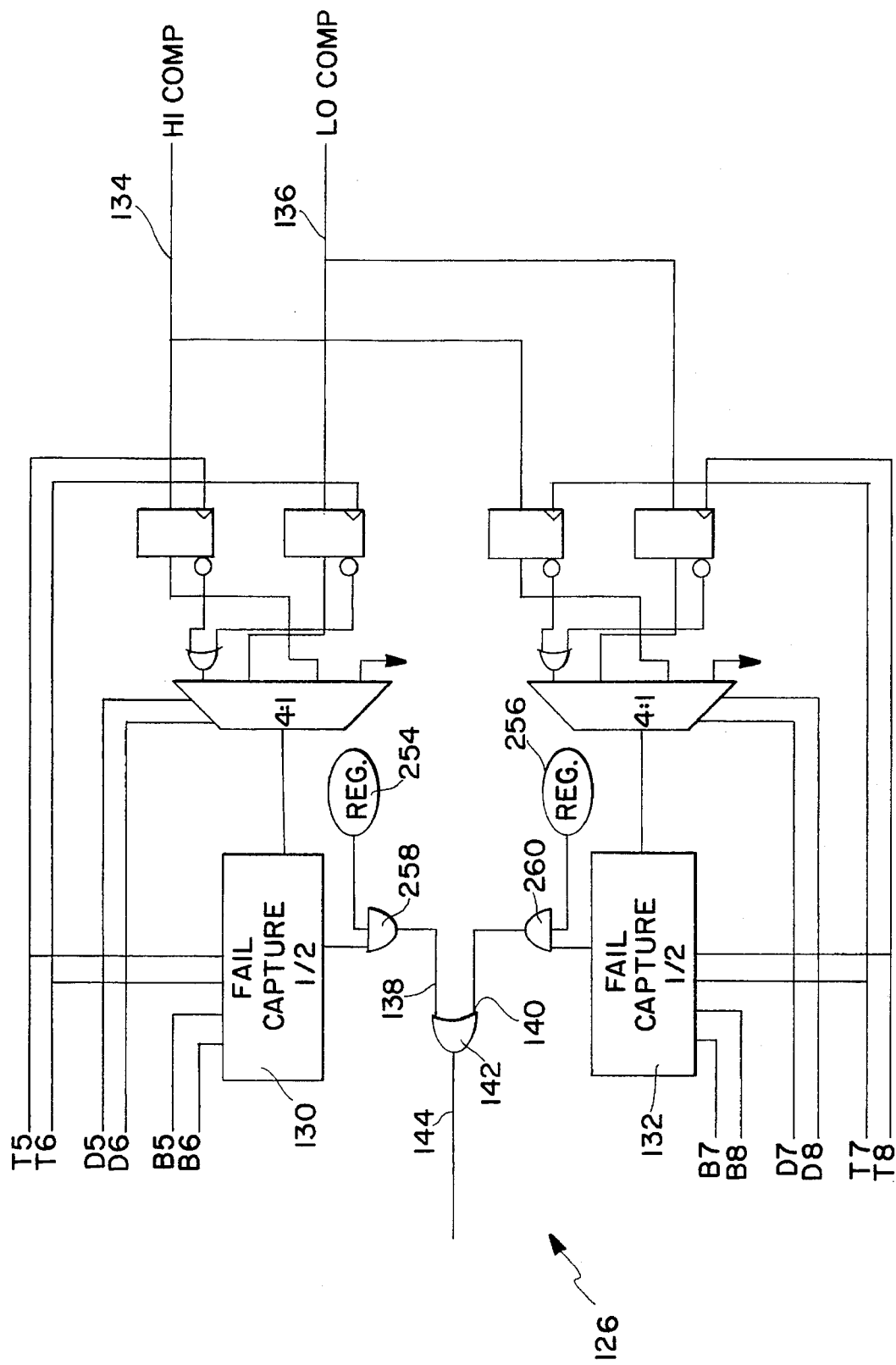
FIGS. 8 and 9 are circuit diagrams of portions of the comparator formatter and fail capture memory shown in FIG. 4.

Each dual comparator 123 is part of largely conventional comparator formatter circuitry, which, reached over lines 134, 136, also includes edge strobe circuitry 126, which is in the comparator formatter 128, in the BC, and shown in more detail in FIG. 8.

As in the prior art, the dual comparator is provided at each of its high and low portion lines 134 and 136, with a constant high threshold voltage or low threshold voltage output with which the actual return voltage from the DUT is continuously compared.

Shown in FIG. 8 on the left are, in descending order, the lines T5, T6, D5 (data as used with T5 for the driver, but reclocked on T5 in the pulse modulator, sent there from pipe), D6 (related to T6 as D5 was to T5), B5, B6, B7, B8 (burst signals from the second pipe conditioned in the pulse modulator for work with T5–T8, respectively), D7, D8, T7, and T8. B5 and B6 go to a first fail capture memory 130 which includes a 2:1 multiplexer (not shown) which selects between them as directed by a computer-set register (not shown) to provide a shift enable signal to a shift register in the first fail capture memory portion 130. The function of the shift enable signal is to allow the shift register to advance only during the burst (pattern burst). B7 and B8 go to a second such fail capture memory portion 132 with its own 2:1 multiplexer and shift register (not shown). Each shift register has 32 D-flipflops. The output of the second flipflop in each fail capture memory 130, 132 connects to the set terminal of an additional (a thirty-third) flipflop the output of which is connected through AND gates 258, 260 to the respective one of the two inputs 138, 140 of OR gate 142. The fail flag 144 is buffered and sent out of the BC to an "OR" tree along with the corresponding outputs of the other 511 BC's to inform the pattern generator 146 that a failure has occurred on at least one channel, causing the burst signal to go low and stop the burst. The computer resets the fail memories to zero before the next burst. At the end of a burst, the shift register contains the pass/fail data for the last thirty periods and the computer reads that data. Shown on the right-hand side of the drawing, in descending order, are the high comparator and low comparator lines 134 and 136.

Figure 9:
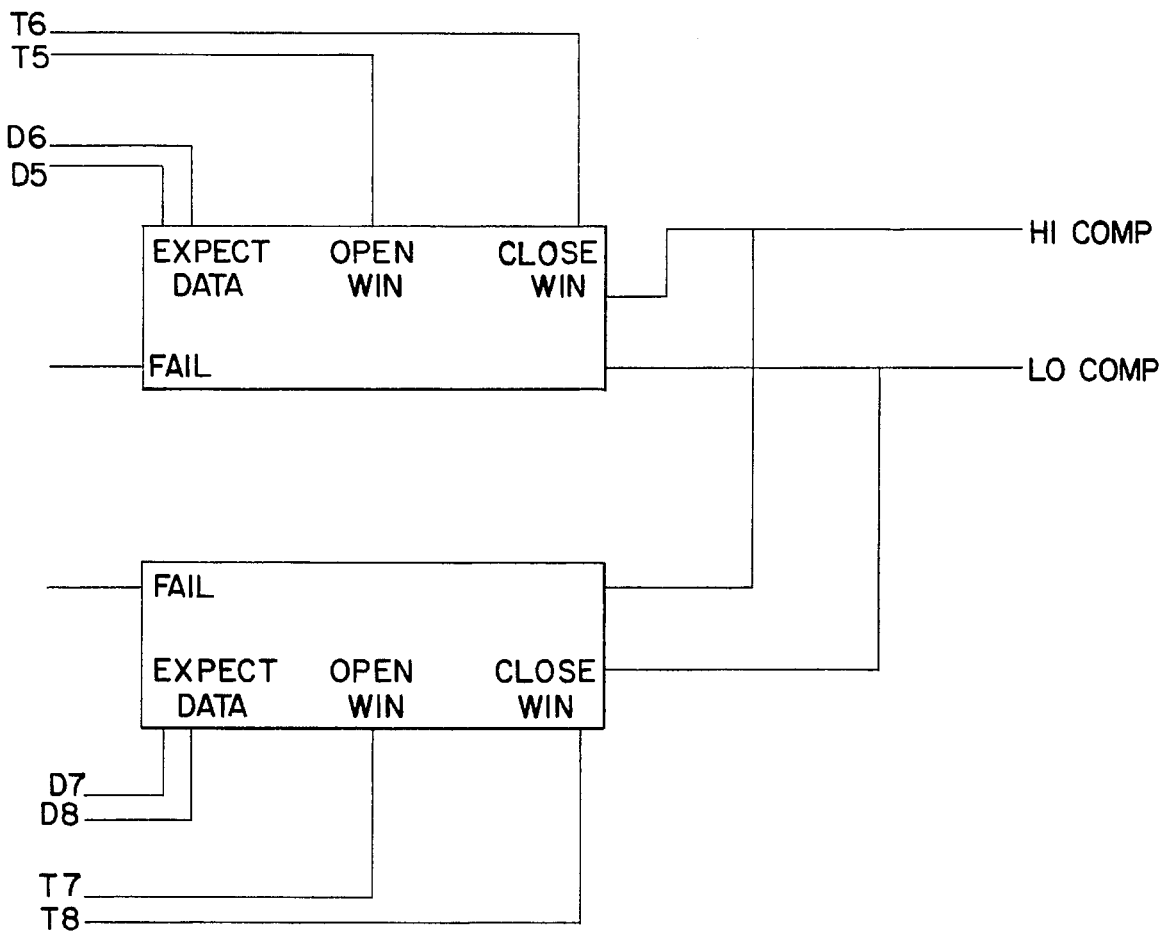

Each dual comparator 123 is also part of largely conventional window strobe circuitry, the rest of which is in the comparator formatter 128, which is in the BC and the right half of which is shown in more detail in FIG. 9; the circuit of the left half of said window strobe circuitry is common to the left half of FIG. 8 (a multiplexer, not shown, switches between the two), and the other half is conventional.

The second pipe 50 above mentioned, which is ganged with the first pipe 48 to the pipe register, accepts the burst ("Test") signal and delays it for the same number of periods as the delay in the first pipe 48 (the two pipes are constructed identically). The output of the second pipe is reclocked on its respective T5, T6, T7, or T8 in the pulse modulator 44, and emerges as B5 through B8 respectively into the respective fail capture memory portions 130, 132.

Figure 14B:
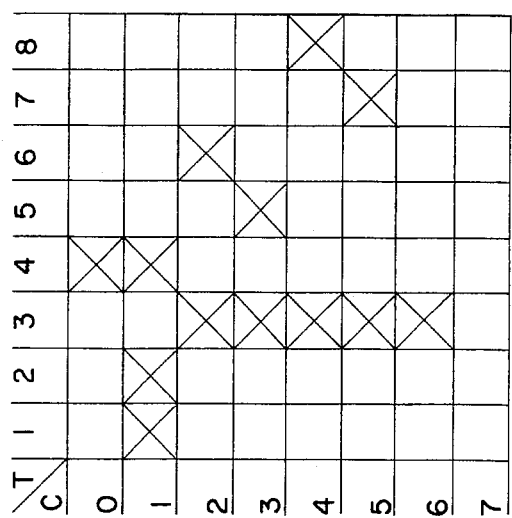

When driver off is enabled and commanded (as by the X in the box of TER 200 in FIG. 14(c) and the X at T3 in C2 in FIG. 14(b), respectively), T5 through T8 are ready for a comparator period function. For comparator functions, T5 is always paired with T6, and their joint two bit output used to select among four period comparator modes.

One more thing that must be done for comparator function periods is that registers 254, 256 must one or both be set through computer 18 between bursts to gate through one or both of AND gates 258 and 260.

If edge strobe function is chosen T5 and/or T7 strobes high, and T6 and/or T8 strobes low. The two bits from the palette lookup output of the strobing pair provide a command selecting one of four conditions for the period: "don't care" (00), "expect high" (01), "expect low" (10), and "expect midband" (11).

Figure 15B:
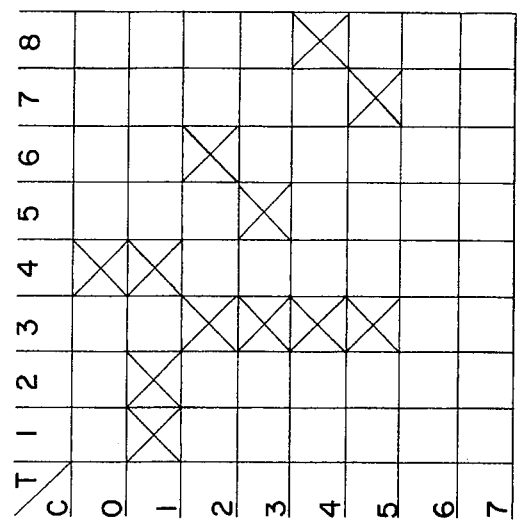

If the window strobe is chosen, everything is the same, except that the odd members of the paired timing generators open (i.e., "start") windows, and the even members close (i.e., "stop") them. Thus, in FIG. 15(a) T7 opens and T8 closes a window in each of the fifth and seventh periods; but as shown in FIG. 15(b) the 7–8 pair produces different outputs, calling for respectively the expect low of the fifth period and the expect high of the seventh.

Figure 10:
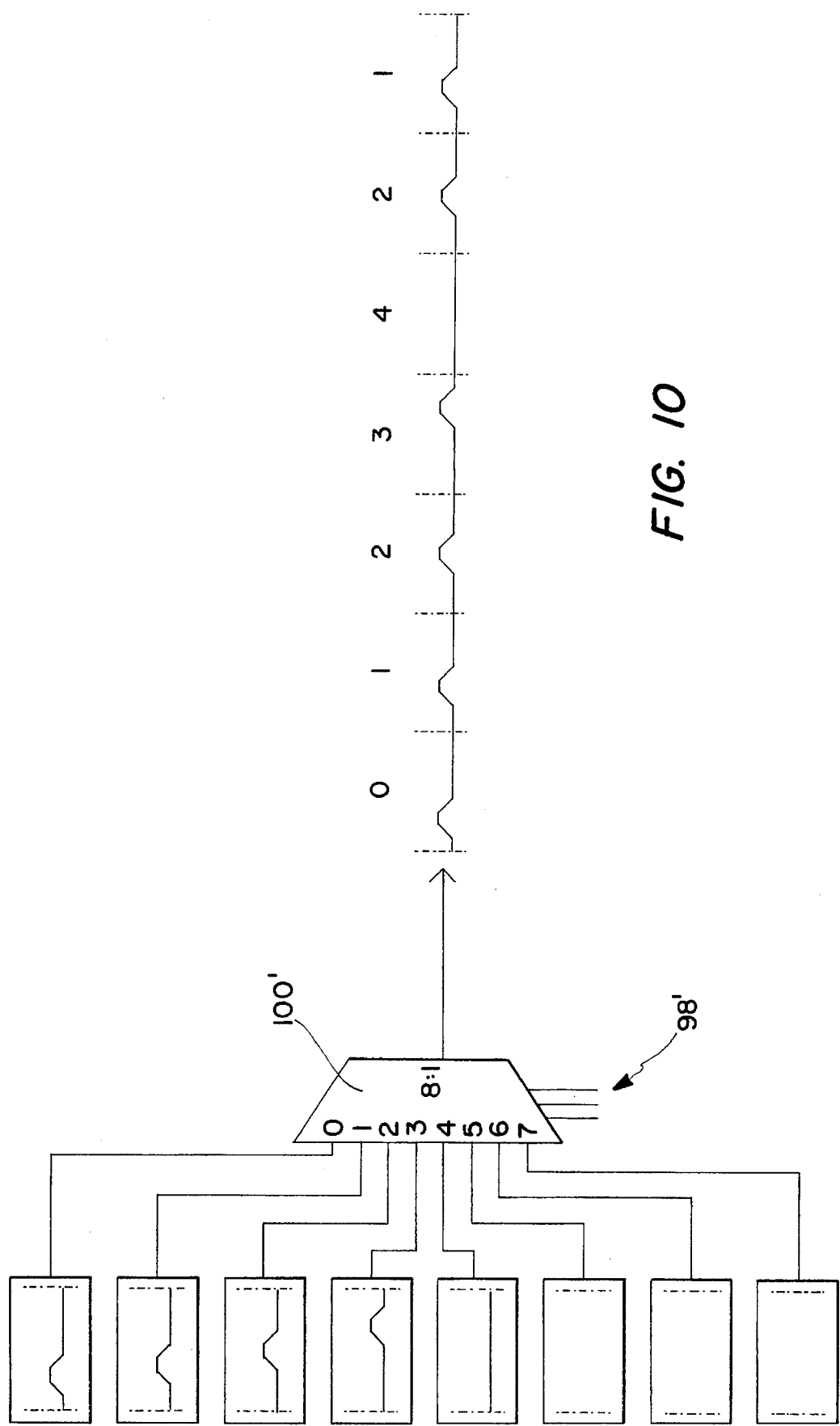
FIG. 10 is an abstract user-oriented illustration of a palette lookup according to the invention and its resultant driver trace.

Referring now to FIG. 10, there is shown (abstractly, and from a user point of view) on the left a set of eight boxes with outputs numbered 0 through 7. In each box is illustrated a wave shaped and located within a period (periods being indicated in each box, and on the output trace illustrated in FIG. 10, by adjacent pairs of vertical dotted lines) as specified by, acting in concert, the particular three-bit group delivered by the data serializer 96 to the palette lookup 46 for any particular period, and the timing generators selected for firing by that three-bit group, both which TG's are selected, and the delay settings on the selected TG's. In the top box is illustrated the timing, width, and polarity of the pulse produced by the three bits furnished the eight palette lookup multiplexers at the 0 setting of the eight multiplexers 100, for one channel in one period for a particular burst. The lower boxes, in descending order, similarly show the pulses (if any) produced in other periods of that channel and burst by, respectively, lookup palette multiplexer settings of 1, 2, 3, 4 (no pulse), and (not 5, 6, and 7. (Each lookup palette includes one multiplexer 100; one of these, with its related register 102, is shown in FIG. 6. Each of the eight lookup palettes is a part of a respective one of the eight TG's of one BC.)

The trace in the right-hand portion of FIG. 10 illustrates the pulses produced in the driver waveform by the data sequence 0123421, using the three-bit choices illustrated in the vertically arranged boxes of FIG. 10.

The multiplexer 100' shown in FIG. 10 is an abstract composite of the effect of eight multiplexers 100, each of which contributes to the content of one of the eight boxes shown in FIG. 10.

Seven period waveforms are shown in the trace of FIG. 10, the first by the 0 setting of one of the group of eight eight-bit inputs visualized as a group at 98', the second by the 1 setting, the third by the 2 setting, the fourth by the 3 setting, the fifth by the 4 setting, and the sixth and seventh respectively again by the 2 and 1 settings.

Other trace waveform portions are shown in FIGS. 11(d) (four periods only), 13(d) (seven periods), 14(d) (eight periods), and 15(d) (eight periods), the latter two including respectively edge strobe and window strobe periods. The palette lookup of the invention makes possible selective creation of all these and an effectively infinite number of others.

Figure 11B:
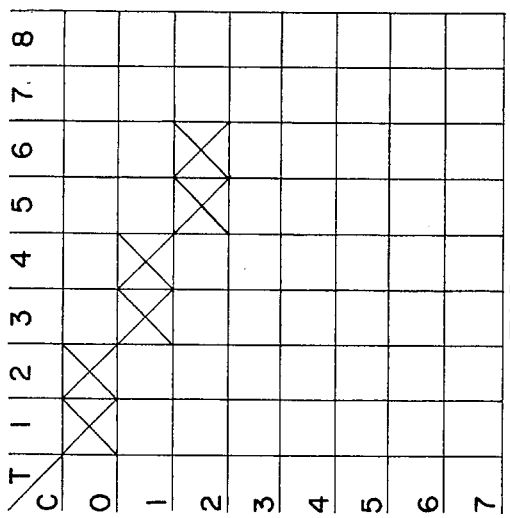

FIG. 11(d) illustrates a four-period sequence driver trace rather than a seven-, as in FIG. 10. The first period of FIG. 11 however corresponds with the first period of FIG. 10, as does FIG. 11(a), which illustrates that to create the period waveform shown in the zero box of FIG. 10, TG 1 and TG 2 are instructed by the instruction 0 to fire (as indicated there and elsewhere by spikes) during the first period; when during that period they fire is governed by the delays set into each as above described. FIG. 11(b) shows that the 0 instruction on command (CO) caused both TG 1 and TG 2 to fire during the first period. Odd timing generators producing rising edges, TG 1 produced the rising edge of the first period pulse shown in FIG. 11(d); even timing generators producing falling edges, TG 2 produced the falling edge of that pulse, while together they controlled polarity; the location (including) width of the pulse were also affected by the delays set into TG 1 and TG 2.

The data set into each timing generator lookup palette for any particular period are all for the same one of any of eight choices; thus, in the first period for FIG. 11(a)–11(d), the choice is zero, and for zero each of the eight palette settings is as set forth at CO of FIG. 11(b).

In FIG. 6 is shown the TG 1 multiplexer in this burst, and, as seen at "CO" (command for 0 setting) of FIG. 11(b), the zero three-bit setting sets TG 1 at 0 to fire, as indicated by the spike in the first period shown in FIG. 11(a), to produce the rising edge of the driver pulse shown in FIG. 11 (d).

During the bursts of FIGS. 10 and 11(a) through 11(d), the only settings of the timing enable register 200 are as shown in FIG. 11(c).

There being eight FIG. 6 multiplexer arrangements in the lookup palette 46, each having a common three-bit eight-choice control, there is produced in effect a 64-box matrix as illustrated in FIG. 11(b). Indicated in FIG. 11(b) are the eight choices entered into the matrix by the computer for the driver burst trace shown in FIG. 11(d). As shown, the CO setting calls also for the firing of TG 2, shown by the spike in FIG. 11(a), and again in the falling pulse edge FIG. 11(d). The C1 setting in period 2, similarly, fires TG 3 for a rising edge and TG 4 for a falling edge; and so on, as clearly illustrated in FIGS. 11(a) through 11(d).

The numerals across the top of FIG. 11(a), as well as FIGS. 13(a), 14(a), and 15(a) refer to number of cycles within the periods; the sixth cycle of each period is coincident with the 0 cycle of the successive cycle and beginning of the successive period, and is numbered "0".

(FIGS. 11(a), 13(a), 14(a), and 15(a) are actually plots of those pulses in the eight timing generators T1-T8 which are gated through the pulse modulator 44; also their spike shape indicated is only given in the gating pulse modulator. Although not shown, each TG produces one pulse each period; e.g., T1 really pulses at 0 count each period, but is gated only in zero command periods.

Figure 13B:
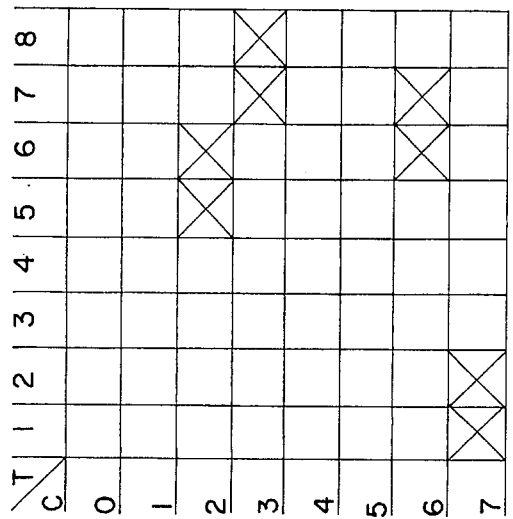

FIGS. 13(a) through 13(d) are similar to FIGS. 11(a) through 11(d), respectively, but illustrate a channel burst portion of seven periods, in which the pulses are of polarity opposite to those of FIGS. 11(a) through 11(d), and are of varying width. Here the only settings in the timing enable register ("TER") 200 are the six enabling firings of high or low as noted, as called for by FIG. 13(b). Thus, for the first period illustrated, the inverted pulse shown in FIG. 13(d) is produced by firing TG 8 and TG 7, at the times (counts 2 and 3, respectively, top row of FIG. 13(a)) indicated in the figure. (The X's in boxes of FIGS. 11(c), 13(c), 14(c), and 15(d) indicate what TG's may—are permitted (enabled) to possibly—fire during a particular period; which ones do fire during the period is otherwise controlled for each period by the palette lookup 46—C3, FIG. 13(c)—and pattern memory 92.)

In the second period, C1 is programmed to produce no change in the trace as received from the first period. No TG fires; i.e., FIG. 13(a) is without spikes in this period. No driver pulse results in this period, accordingly.

In the third period, a wide inverted pulse results from the firing of (C2) TG 6 at count 1 to produce a falling edge, and TG 5 at count 5 for a rising edge. The fourth and fifth periods jointly produce a period-overlapping inverted pulse resulting from firing (C7) TG 2 at count 5 in the fourth period, and TG 1 at count 2 in the fifth period. (Actually, the TG 1 firing was in effect on a count of 8 (pipe 1 plus count 2) from the beginning of the fourth period illustrated, such ability to delay beyond one or more periods being an important programming capability of relatively inexpensive embodiments of the invention.) In the sixth period (C3), the pulse is produced by firing TG 8 at count 2 and TG 7 at count 3. In the seventh period, TG 6 is fired at count 1 and then TG 7 at count 3.

In FIGS. 14(a) through 14(d) are illustrated the use of a palette of the invention to construct not just to drive, as in the otherwise analogous figures above described, but as well to compare.

Eight I-load units 140 are carried by each channel card 14, one to a channel.

TER settings are shown in FIG. 14(c).

In the first period, we begin with the trace at an intermediate I-load voltage, at the voltage of the previous (I-load, not shown) period. This, however, is a drive period, so, at count 2, pursuant to FIGS. 14(b) and 14(c) TG 4 fires to turn on the driver (as shown in FIG. 14(a)), which goes low because that was its condition when last (not shown) on. The TG 1 firing at count 3 drives the driver high, and the TG 2 firing at count 5 drives it back down low to complete the first period pulse shown.

The trace moves then into the second period (a comparator period) illustrated. The drive low voltage continues until T3 on count 1 turns off the driver, letting I-load drive the voltage to the intermediate I-load level. T6 then fires at count 1½ (using the late register), to here edge strobe with an "expect low" comparison (FIG. 14b, C2).

The odd-numbered timing generators T5 and T7 are used to strobe high; the even numbered generators T6 and T8 are low strobers.

The comparator mode voltage continues on into the third period, another comparator mode period, in which T3 at count 1 fires a here redundant (because the driver is already off) "driver off" command and then at count 1½ T5 fires an edge strobe high command, C3 (FIG. 14b) commanding "expect high".

The intermediate voltage continues into the fourth period, wherein the driver is turned on by T4 at count 2, causing reversion to the most recent prior (in period 2) driver on voltage, low. This situation continues into the fifth period, when the driver is turned off by T3 at count 1. After TG 3 turns off the driver, TG 8 strobes low at count 5 of period 5, and C4 commands "expect low".

The sixth period is another driver period, and is identical with the first period illustrated. The seventh period is identical with the second, except that strobe is high by TG 7 at count 5, and "expect high" commanded by C5. In the eighth period, nothing happens: even the spike showing, TG—T—3, is redundant.

The invention thus permits making many changes on the fly (i.e., within a single burst). Thus, e.g., in the seventh period strobe was at a count of 5, while in the third period it was at a count of 1½. While this is not true of TER settings (e.g., as in FIG. 14(c), it is true of memory commands (e.g., as in FIG. 14(b) ).

As noted in connection with FIGS. 14(a) through 14(c), timing generators may be fired on half counts (a count corresponding to one 360° clock cycle in time duration) as well as counts. Early clock leading edges are used, of course, to fire on a count, and late clock leading edges to fire on half counts. Firing may be set anywhere else within the 360° of a count or cycle, at 25 or less picosecond intervals, using the verniers in the manner already and hereinafter described.

FIGS. 15(a) through 15(d) are like FIGS. 14(a) through 14(d), except that window rather than edge strobes are used.

The first period is identical with the edge strobe first period illustrated in FIGS. 14(a)–(d).

The second period (010 digitally, i.e. 2) is again a comparator period with TG 3 turning off the driver (FIGS. 15(a) and 15(c) ), with TG 5 opening the window and TG 6 closing the window. The lack of an X in FIG. 15(c) for either TG 5 or TG 6 means that for this burst these TG's are free for a comparator function, and when so free respectively signal to open and to close a window in each period (meaninglessly, for any period not in fact a window strobe comparator period). "Expect low" was communicated pursuant to C2 in FIG. 15(b) by the TG5-TG6 palette lookup output.

In the third period, T3 fires redundantly to "turn off" the already-off driver at count 1, the window is opened and closed as in the second period, and T5–T6, pursuant to C3 (FIG. 15(b)), instructs the window to expect high.

In the fourth period, T4 turns on the driver, which goes to its last state, low, a condition that continues until in the next period T3 turns off the driver, letting the voltage go back to its intermediate position, and completing another "return to zero" drive mode function. During this fifth period occurs also a window strobe, opened and closed as in the second and third periods, but this time instructed by C4 through T7–T8 to expect low, and with the window, this time one late in the period, opened and closed by T7 and T8.

The sixth period is another driver period, just like the sixth of FIGS. 14(a)–(d).

The seventh period is just like the fifth, except that here the window expects high, pursuant to C5 and T7–T8.

The eighth period is like the third, except that there is no strobe: a "don't care" period (C6).

Timing enable register 200, shown programmed in different ways in FIGS. 11(c), 13(c), 14(c), and 15(c), provides a valuable feature adding greatly to flexibility of choice and use.

Thus, TG's 1 through 8 may any one or more of them be set through the computer 18 to enable "firing" (gating through and reshaping in pulse modulator 44) to drive voltage in the driver high (odd-numbered TG's) or low (even-numbered TG's). The "T1 HI" through "T8 LO" boxes in, e.g., FIG. 14(c) reflect these eight possible enabling settings, and the X's in certain of those boxes reflect the particular enablings set in for the burst portion shown in FIG. 14(a). Pursuant to these enablements, commands from the palette lookup 46 pursuant, correspondingly e.g., to the table of FIG. 14(b), cause the firings illustrated in FIG. 14(c). Thus, TER 200 may be set by computer 18 to enable any of the TG 1 through 8 firings when ordered by the three-bit input 98 (FIG. 6), with the delay set prescribed by selected counters and verniers through computer 18. TG's 3 through 6 may also be computer-set (for an entire burst, as was the setting discussed in the previous paragraph) to enable turning a respective driver 82 off (T3 or T5) or on (T4 or T6). Eight of the 12 lines 202 from TER 200 to pulse modulator 44 do the pulse-enabling discussed in the preceding paragraph; the remaining four of the 12 enable the driver on-off functions just mentioned. A partially second portion of the T3–T6 pulse modulators function through second outlet lines 250 to thus selectively gate through the driver on-off circuitry some or none of the timing generator pulses. (First outlet lines 252 handle the group of eight of the previous paragraph.)

The advantageously numerous and flexible edge functions of the eight timing generators (TG (or T) 1 through 8) are set forth in the following table:

| TG | DRIVE | E. STROBE | | WINDOW S. |
|----|-------|-----------|-----|-----------|
| T1 | HI    |           |     |           |
| T2 | LO    |           |     |           |
| T3 | HI    | OFF       |     |           |
| T4 | LO    | ON        |     |           |
| T5 | HI    | OFF       | HI  | START     |
| T6 | LO    | ON        | LO  | STOP      |
| T7 | HI    |           | HI  | START     |
| T8 | LO    |           | LO  | STOP      |

The first two columns set forth the twelve enablements available through the 12 bits 202 as above explained. The third column reflects that in comparator mode with edge strobe selected by computer 18, strobes high are provided by T5 and T7, and strobes low by T6 and T8; what to do with these edge strobes (expect high or low and so on) is governed by the output of the TG pair involved in the strobing, as elsewhere herein described. The fourth column has window strobe selected, and shows that in that mode T5 and T7 open windows and T6 and T8 close them. (T5 and T6 are paired for the comparator mode to provide from their two palette lookup outputs the two bits required for four palette command options.)

The driver waveforms above illustrated will be collectively recognized by those skilled in the art as in the "return to zero" drive mode.

As is well known in the art, calibration of test circuitry using a time domain reflectometer ("TDR") is required initially and periodically.

In the preferred embodiment, full calibration requires some calibrations using both driver and comparator functions, and other calibrations using one or the other only of those functions.

In the first category, the following measurements are made using each timing generator in turn and entered into a computer 18 memory (not shown) calibration table:

1. The delay, compared to that in the master comparator of the TDR 180 when all timing registers of the BC except the period register are set to zero and the period register is set to 128, for each step setting (coarse and fine) of the vernier—the "step measurements".

2. The backgating delays, with all timing registers set at zero, except coarse vernier at 4 and fine vernier at 6, compared to that in the TDR 180 master comparator (not shown), of setting the period register at 2,3,4,8, 16,32,64, and 128—the "backgating measurements".

3. With the registers as in paragraph 1, delays in the BC (caused in the portions of it before the match block) caused by frequency change are measured in the master comparator at frequencies corresponding to periods (in nanoseconds) of:
   3.33, 3.75, 4.17, 4.58, and 5.0, in both the early and late cycles—the "clock symmetry measurements".

For the driver function only:

4. With all timing registers set at zero, using each timing generator in turn the delay at the DUT caused by wire length variation in the DIB and other system delay variations, using multiple measurements including some reflectomerry the "driver offsets".

Finally, for the comparator function only:

5. With T5 through T8 timing registers set at zero, using each of T5 through T8 in turn, the delay at the DUT caused by wire length variation in the DIB and other delay variations, using again multiple measurements including some reflectometry, again as known in the art—the "comparator offsets".

There are nine TDR's, all, like the DIB 12, mounted on a test head (not shown) as is conventional. Eight of the TDR's are each connected to the channels of eight channel cards, for calibrating the 64 slices represented by each channel card, to assure colinearity of those 64. A ninth TDR on the test head produces colinearity among the eight groups of 64 served by TDR's 1 through 8.

Computer software now, testing having begun, makes use of the measurements just listed, and which are now in the software calibration tables, as shown in FIG. 16.

First, the computer test program makes a request $T_R$ 400 (FIG. 16) that an edge reach the driver at, say, 30 nanoseconds.

To this value is then added (402) from the calibration table above referred to the driver offset ("DO"), say 5.1 nanoseconds, obtaining 35.1. To this latter figure is then added the backgating frequency measurement ("BG") at the period (six, here) being used, which in this embodiment requires interpolation among the calibration table curves, resulting from the measurements taken as above, and turns out to be 0.2 nanoseconds (200 picoseconds), for an adjusted edge time ($T_A$) total of 35.3 nanoseconds.

This figure is then (404) divided by the number of nanoseconds in a period, 24, to obtain two numbers, one the integer number of times P 24 will go completely into 35.3, and the other the number ($R_P$) remaining when the integer times 24 ($PD_P$) is subtracted from 35.3—i.e., respectively 1 and 11.3. The pipe ("P") needed is thus 1.

The clock providing 4 nanoseconds delay per count ("C"), the software next divides 11.3 in the same way, to reach answers of 2 and a remainder ($R_C$) of 3.3—prescribing therefore a count of 2.

The remainder 3.3 is then (408) divided by the additional delay ("H") made available using the late clock, about 2 nanoseconds, but the exact value being taken with interpolation by the computer from the clock symmetry measurement in the calibration table (2.09 ns), to produce the numbers 1 and 1.21 ns (the late clock having been off by 0.09) for H and $R_H$.

In light of this remaining delay ("$R_H$"), 1210 picoseconds, the software then (410) selects the nearest coarse vernier step below this amount; in the example here given, that step will be 1100 picoseconds, so that 110 picoseconds is left to be dealt with by the fine vernier's next lower step (412), which if at 100 leaves an off-target residue of 10 picoseconds.

Pipe register 52, count register 54, E/L register 34, coarse register 40, and fine register 42 are thus respectively set by the computer 18 at 1, 2, early, step 4, and step 4—the first two having been calculated and the last three "looked up" by the computer.

The results for each total delay are stored in a computer memory cache, so that they are accessed there for future requirements without need to repeat these steps.

For a driver edge calculation, numbered calibration paragraphs (supra, pp. 32–33) 4, 1, 2, and 3 are used. For a comparator edge calculation, paragraphs 5, 1, 2, and 3 are used.

Other Embodiments

Other embodiments will occur to those skilled in the art. The burst chip may be formed in, thus, silicon.

Various elements of the preferred embodiment combinations may be omitted, supplemented, or substituted.

Burst chip area size and delay in the BC following timing generators may be varied.

More or fewer timing generators may be included; more or fewer bits may be directed to palette lookups; more or fewer counts per period may be used.

All these are exemplary only, not exclusive.

What is claimed is:

1. Burst-shaping circuitry which comprises
a palette lookup including
a plurality of register means,
a corresponding plurality of multiplexers, and
a pulse modulator,
each said register means being selectively settable, and
each said register means being arranged to deliver through a corresponding said multiplexer to said pulse modulator data commands into said multiplexer through said register cooperating with its respective multiplexer.

2. ATE burst circuitry comprising
a multiplicity of timing generators, each said timing generator including
a count register settable to determine desired number of counts,
a match element transmitting an edge upon the reaching of said desired number,
a vernier,
a palette lookup for receiving data from a memory in successive bit groups and issuing commensurate commands, and
a pulse modulator for receiving an edge from said vernier and said command from said palette lookup, said command selectively restricting passage of said edge through said pulse modulator.

3. The circuitry of claim 2 in which said circuitry is implemented in a single chip.

4. The circuitry of claim 3 in which said chip is of gallium arsenide.

5. The circuitry of claim 2 which includes also a timing enable register, said timing enable register being selectively settable to enable either high-low drive or driver on-off function in said pulse modulator.

6. The circuitry of claim 2 in which certain of said timing generators may be selectively placed in a comparator period mode.

7. The circuitry of claim 6 in which a pair of said timing generators may be placed in a cooperative relation in said comparator mode, said pair being arranged to accept as bits two palette lookup outputs and command using the four choice outputs thus available one of four different comparator strobe treatments.

8. The circuitry of claim 6 in which at least one of said timing generators has an edge strobe high command capability, and at least another has an edge strobe low capability.

9. The circuitry of claim 6 in which at least one of said timing generators has an open window strobe capability and at least another one of said timing generators has a close window strobe capability.

10. The circuitry of claim 7 in which said treatments are "don't care", "expect low", "expect high", and "expect midband".

11. A method of operating automatic test equipment for testing semiconductor circuits, the test equipment having multiple channels each having multiple timing generators which generate timing signals at programmed intervals with respect to one of a plurality of period clock signals, the period of which can also be programmed, the method comprising the steps of:

a) constructing a calibration table containing corrections for differential delays through at least a portion of each channel when each of the plurality of clock signals is used to generate timing signals, the calibration table including the differential delays measured for multiple programmed periods of the clock signals;

b) adjusting the value of a programmed interval to be generated by a timing generator in a channel by retrieving values from the calibration table for that channel based on the programmed period and period clock signal with respect to which the timing signal is to be generated;

c) using the adjusted value to generate a timing signal.

12. The method of claim 11 wherein the plurality of period clock signals comprises a first period clock signal and a second period clock signal generated from a single clock signal, the first and second period clock signals being about 180° out of phase.

13. The method of claim 12 wherein each channel is formed with GaAs semiconductor components.

14. The method of claim 11 wherein automatic test equipment includes a computer having memory storing a test pattern and each timing generator comprises programmable delay circuitry which delays a timing signal in response to a digital value entered into a register, and a) the step of constructing a calibration table comprises constructing a calibration table in memory associated with the computer;

b) the step of adjusting comprises retrieving values stored in the test value representing programmed intervals and adding to them a delay value computed from the values stored in the calibration table; and c) the step of using the adjusted value comprises loading the adjusted value into a register controlling the programmable delay circuitry.

15. The method of claim 14 wherein the test pattern specifies a burst of test signals and the adjusted values are loaded into the register at the start of the burst and are not changed during the burst.

16. The method of claim 11 wherein the step of adjusting comprises:

a) when the programmed period of the period clock signals matches a value for which values are stored in the calibration table, using a value in the calibration table for adjusting the value of a programmed interval; and b) when the programmed period of the period clock signals does not match a value for which values are stored in the calibration, interpolating between two values stored in the table and using the interpolated value for adjusting the value of a programmed interval.

17. The method of claim 11 wherein a) the step of constructing a calibration table includes storing in the table corrections for differential delays for each timing generator, the table including entries at a programmed interval for programmed period values; and b) the step of adjusting the value of a programmed interval also includes retrieving from the table one of the values stored in step a) and adjusting the value of the programmed interval based on that value.

18. Automatic test equipment which generates test signals at a frequency which can be programmed, comprising:
   a) a computer and a data bus;
   b) means for generating a test pattern burst, the test pattern comprising a plurality of successive codes for each channel of the automatic test equipment;
   c) a plurality of channel circuits, each containing:
      i) a plurality of timing generators which generate timing signals, each having:
         A) programmable delay circuit having a pulse input, a digital delay input and timing pulse output which occurs an amount of time following the pulse input which is controlled by the digital delay input;
         B) a timing register having an input connected to the digital data bus and an output connected to the programmable delay circuitry;
      ii) a pulse modulator circuit having timing signal inputs each coupled to a timing generator in the channel, a data input coupled to the means for generating a test pattern and for providing the successive test codes to the pulse modulator, and timing signal outputs, the pulse modulator gating selected timing signals from its input to its output in accordance with the value at its data input;
      iii) a drive format circuit responsive to a plurality of timing signal outputs from the pulse modulator, said drive format circuit producing an output signal starting upon the occurrence of any one of a first subset of the timing signal outputs and ending upon the occurrence of any one of a second subset of the timing signal outputs; and
   d) wherein the computer includes
      i) means for storing a plurality of calibration tables, at least one of the tables storing calibration values for each timing generator to be used at different programmed frequencies;
      ii) means for storing a desired delay value for each of the timing generators during a pattern burst, the computer further including means for adjusting the desired delay values based on values in the calibration tables and the programmed frequency; and
      iii) means for loading the adjusted values into the timing registers.

19. The automatic test equipment of claim 18 additionally comprising in each of the channel circuits a compare format circuit responsive to a plurality of timing signal outputs from the pulse modulator circuit.

* * * * *